(12) United States Patent
Shcherback et al.

(10) Patent No.: US 12,298,367 B2
(45) Date of Patent: May 13, 2025

(54) MAGNETOMETER SYSTEM AND METHOD

(71) Applicant: Elta Systems Ltd., Ashdod (IL)

(72) Inventors: Igor Shcherback, Beer Sheva (IL);
Dmitriy Tokar, Beer Sheva (IL);
Ronen Wolf, Lehavim (IL); Avi Elmalem, Kibbutz Shoval (IL)

(73) Assignee: Elta Systems Ltd., Ashdod (IL)

( * ) Notice: Subject to any disclaimer, the term of this patent is extended or adjusted under 35 U.S.C. 154(b) by 159 days.

(21) Appl. No.: 18/100,310

(22) Filed: Jan. 23, 2023

(65) Prior Publication Data

US 2023/0243901 A1  Aug. 3, 2023

(30) Foreign Application Priority Data

Feb. 2, 2022  (IL) .......................................... 290465

(51) Int. Cl.
*G01V 3/00*   (2006.01)
*G01R 33/26*  (2006.01)

(52) U.S. Cl.
CPC .................... *G01R 33/26* (2013.01)

(58) Field of Classification Search
CPC ...................................................... G01R 33/26
USPC ......................................................... 324/304
See application file for complete search history.

(56) References Cited

U.S. PATENT DOCUMENTS

| | | | |
|---|---|---|---|
| 3,722,982 A * | 3/1973 | Brandt | G02B 27/28 359/247 |
| 7,929,586 B2 | 4/2011 | Canham | |
| 9,599,834 B2 | 3/2017 | Zhang et al. | |
| 10,725,123 B2 | 7/2020 | Shalev | |
| 10,739,416 B2 | 8/2020 | Nagasaka et al. | |

(Continued)

FOREIGN PATENT DOCUMENTS

| CN | 113842147 A | 12/2021 |
|---|---|---|
| IL | 224958 | 6/2013 |

(Continued)

OTHER PUBLICATIONS

"Depolarizer (Optics)", Wikipedia. https://en.wikipedia.org/w/indec.php?title=Depolarizer_(optics)&oldid=747703088.

(Continued)

*Primary Examiner* — Walter L Lindsay, Jr.
*Assistant Examiner* — Frederick Wenderoth
(74) *Attorney, Agent, or Firm* — Dorsey & Whitney LLP

(57) ABSTRACT

The present disclosure provides a magnetometer for measuring a magnetic field B in the vicinity thereof. The magnetometer includes a vapor cell comprising atomic vapor; an optical processor for receiving a light beam and directing said light beam, as a probe light beam, to enter the vapor cell with a certain predetermined intensity $I_1$ and a certain predetermined polarization state $P_1$ to serve for interacting with at least one type of Alkali-like atoms in the atomic vapor of the vapor cell, for probing a Larmor frequency of precession thereof; and a detector for detecting the light beam after interaction with the atomic vapor to generate signals/data indicative of said Larmor frequency. The optical processor includes an optical depolarizer and a polarizer arranged respectively successively (e.g., not necessarily consecutively) with respect to a propagation direction of said light beam, along a propagation path of the light beam through the optical processor.

15 Claims, 6 Drawing Sheets

(56) References Cited

U.S. PATENT DOCUMENTS

2013/0342210 A1    12/2013  Stokely
2016/0116553 A1     4/2016  Kim et al.

FOREIGN PATENT DOCUMENTS

JP    2014092520 A    5/2014
WO    2012038948 A2   3/2012

OTHER PUBLICATIONS

Gozzini, et al., "Transformation of Electromagnetically Induced Transparency into Absorption in a Thermal Potassium Optical Cell with Spin Preserving Coating", 19th International Summer School on Vacuum, Electron and Ion Technologies (VEIT2015). Journal of Physics: Conference Series 700. doi: 10.1088/1742-6596/700/1/012051, 2016, pp. 1-6.

Wolinski, et al., "Polarization of Optical Fibers", Proceedings of the IV International Workshop NOA'98, Midzyzdroje. Acta Physica Polonica A vol. 95, No. 5, 1998, pp. 749-760.

Wu, et al., "A dead-zone free 4He atomic magnetometer with intensity-modulated linearly polarized light and a liquid crystal polarization rotator", Review of Scientific Instruments vol. 86. http://dx.doi.org/10.1063/1.4932528, Oct. 13, 2015, pp. 103105-1-103105-6.

Wyllie, et al., "Megnetocardiography with a Modular Spin-Exchange Relaxation-Free Atomic Magnetometer Array", Physics in Medicine and Biology vol. 57. doi: 10.1088/0031-9155/57/9/2619, Apr. 13, 2012, pp. 2619-2632.

\* cited by examiner

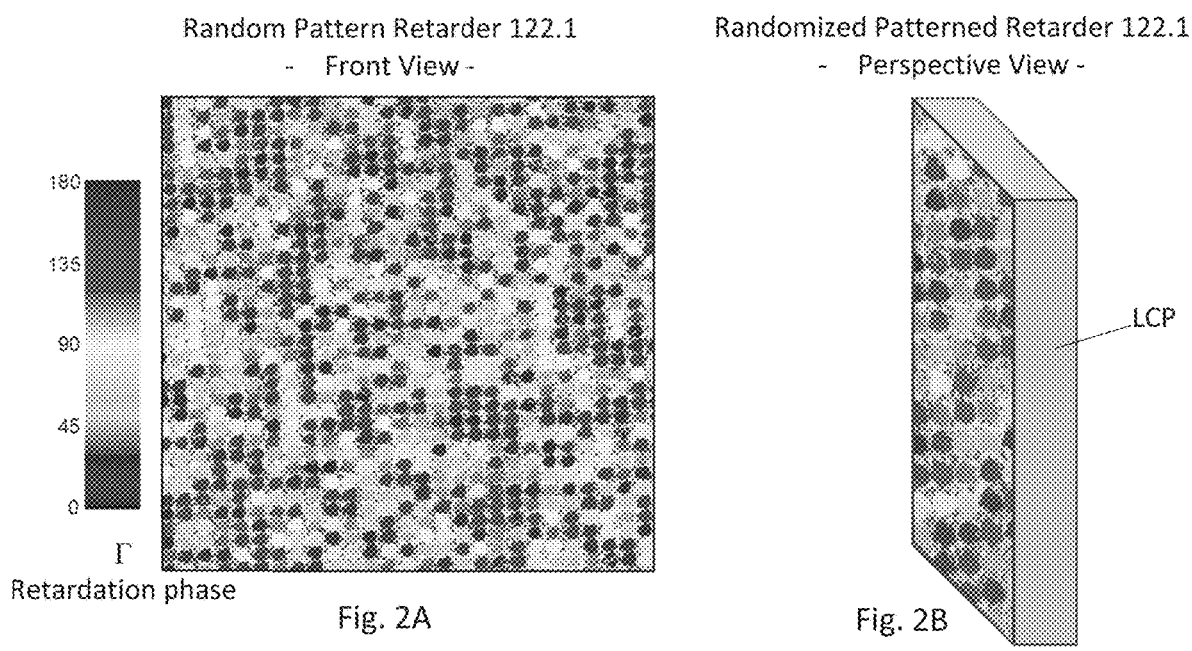
Fig. 2A
Fig. 2B
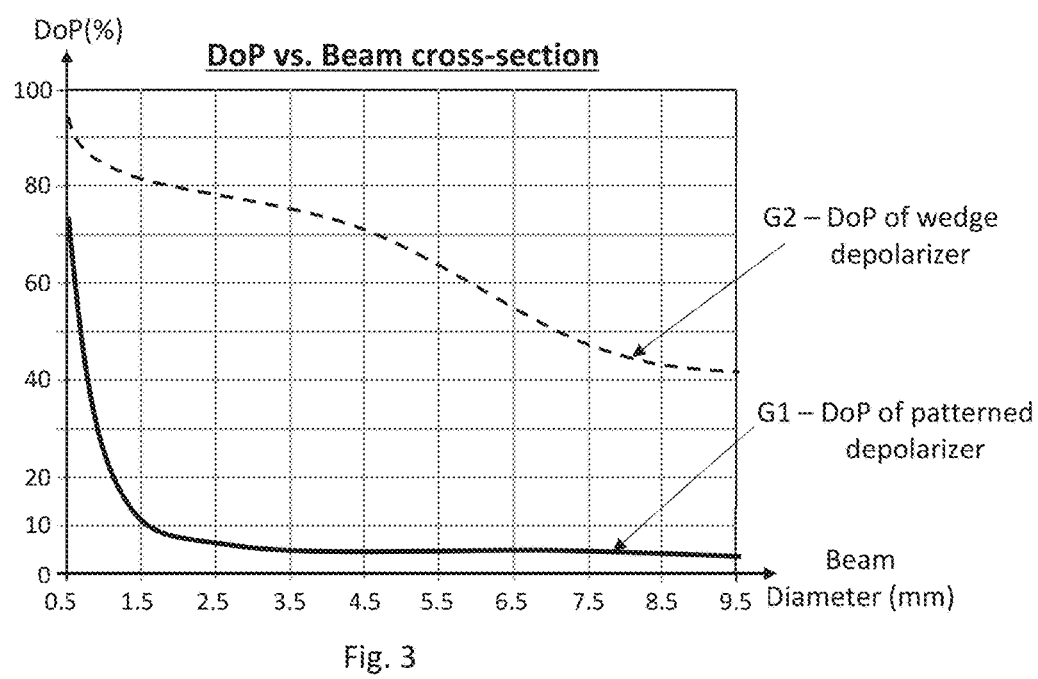
Fig. 3

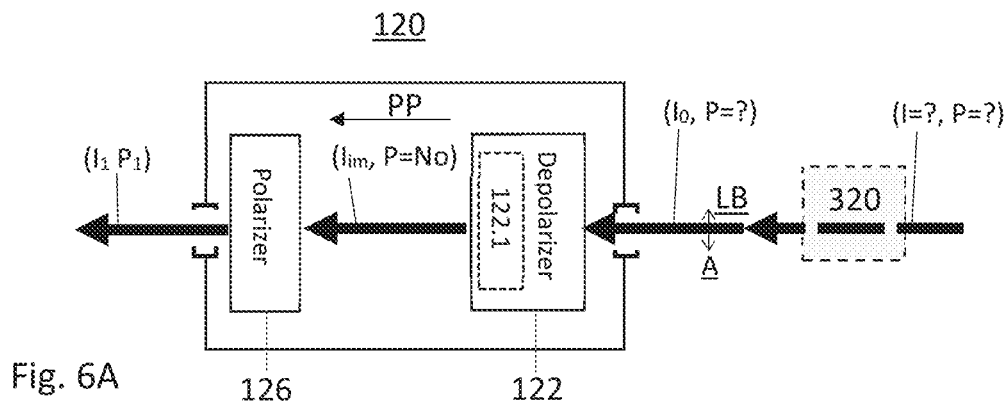

Fig. 6A

200 - Method for Optical Processing of a Light Beam

210 - providing a light beam LB having a certain initial intensity $I_0$ and undetermined polarization $P_0$

212 – said light beam is substantially monochromatic;

214 – said light beam has narrow characteristic cross-sectional area/ diameter

230 - depolarizing said light beam to yield the light beam with certain intermediate intensity $I_{in}$ relative to the initial intensity $I_0$ and un-polarized polarization state;

232 – Carrying out said depolarizing by utilizing a random spatial pattern retarder for spatially randomizing the polarizations of a plurality of different cross-sectional regions within a cross-sectional area A of the light beam;

250 - subsequently to said depolarizing 230, polarizing said light beam to said predetermined polarization state $P_1$

270 - yielding said light beam LB with a certain predetermined intensity $I_1$ relative to said initial intensity $I_0$ and certain predetermined polarization state $P_1$;

290 – Optionally adjusting the initial intensity $I_0$ of the light beam according to intensity attenuation affected thereon by operations 230 and 250, to yield the light beam with a designated intensity $I_1$ and said predetermined polarization state $P_1$;

Fig. 6B

MAGNETOMETER SYSTEM AND METHOD

TECHNOLOGICAL FIELD

The present disclosure is in the field of magnetometers, and particularly relates to atomic magnetometers and techniques for high accuracy magnetic field measurements thereby.

BACKGROUND

Atomic magnetometers (hereinafter also referred to as vapor-cell based magnetometers or magnetic sensors) are widely used in various applications where accurate magnetic field measurements are required. Atomic magnetometers detect an external magnetic field by measuring the coherent precession frequency of atomic spins about the external magnetic field (the measurement is conducted on a vapor cell containing vapor of atomic elements whose spins are measured). Conventionally, two main kinds of atomic magnetometers are used for realizing the coherent precession of atomic spins: radio-optical magnetometers (which apply a radio-frequency magnetic field to excite the atomic magnetic dipole transition, and thereby create the transverse spin component with respect to the external magnetic field direction), and all-optic vapor cell magnetometers (which are typically operable with the Bell-Bloom magnetometer setup and use modulated light of typically circular polarization (pumping) to excite the atomic magnetic dipole transition). Compared with the radio-optical magnetometer, the all-optical (Bell-Bloom) magnetometer does not need to produce the radio-frequency magnetic field and is generally capable of providing more accurate/sensitive magnetic measurements, since interference with the additional RF magnetic field is avoided.

Atomic magnetometers/sensors generally include: a vapor cell (typically a glass tubing) enclosing a certain predetermined substance composition (typically including a certain population of vaporized Alkali-like atoms and buffer gasses), a source of a pumping field (optical field or electronic/RF field) which is applied to the vapor cell to excite vaporized Alkali atoms (or more generally Alkali-like atoms) therein to an excited state so they precess with the Larmor precession frequency when influenced by magnetic field, a detection assembly typically including a probe light beam directed to pass through the vapor cell, and a detector (such as a photodetector or polarimeter) for detecting the intensity or the polarization of the probe light beam after its passage through the vapor cell. The signals from the detector are processed to detect the scale of the Larmor precession frequency with the ground-state spin polarization of the vaporized Alkali-like atoms, which is indicative of the magnetic field. More specifically, determining the amplitude of the ambient magnetic field $|B|$ is done by measuring the Larmor precession $w_L$ frequency of atomic spins of Alkali atoms (according to the relation $$|B| = \frac{w_L}{\gamma}$$

where $\gamma$ is gyromagnetic ratio).

It should be noted that the phrase Alkali-like atoms is used herein to designate any one of the Alkali metal atoms appearing in the first coulomb of the periodic table and/or helium (i.e., the Alkali metals Li, Na, K, Rb, Cs and Fr, as well as He). In other words, the phrase Alkali-like atoms is used herein to designate those having a single electron at the outer shell.

An example of an atomic magnetometer is disclosed in IL Patent No. 224958 describing a magnetic field sensing system including at least one magnetic field sensor unit. Each sensor unit includes a sensor cell including an active medium comprising alkali atoms and an optical switch and defining a light propagation channel through the sensor cell. The optical switch is located upstream or downstream of said sensor cell with respect to a direction of light propagation through said light propagation channel, the optical switch being configured and operable to selectively affect light passage through the light propagation channel to thereby selectively activate said sensor cell to provide output light from the sensor unit.

In another example, U.S. Pat. No. 10,739,416 discloses a gas cell, a magnetic field measurement device, and a method for producing the gas cell. The gas cell includes a cell main body having a first chamber defined by an inner wall, and a first paraffin film provided on the inner wall, wherein, in the first chamber, a gas which interacts with an electromagnetic wave is stored, the first paraffin film is a pure paraffin film, and a paraffin constituting the first paraffin film is arranged such that the directions of the molecular axes are aligned.

U.S. Pat. No. 7,929,586 discloses an electromagnetic pumped Alkali metal vapor cell system. The system includes a vapor cell and windings. The vapor cell contains Alkali metal and a buffer. The windings are positioned around the vapor cell and are configured to create an electromagnet field in the vapor cell when an AC signal is applied to the windings. The electromagnetic field pumps unexcited Alkali vapor into unionized D1 and D2 states.

PCT Patent Application Publication WO 2012/038948, which is assigned to the assignee of the present application, discloses a large-scale, low cost, array of optical magnetometers in which the basic principle is to use a single light source, which can be more powerful than the individual separate sources, and planar optical elements to direct the light to multiple sites of a sensor array.

U.S. Pat. No. 10,725,123, which is assigned to the assignee of the present application, discloses a gradiometer system including one or more magnetic sensor(s). The gradiometer includes an actuation module connectable to the magnetic sensor(s) to vary one or more sensing positions at which a magnetic field is sensed thereby. The one or more sensing positions are varied according to a certain displacement function indicating a predetermined displacement between the sensing positions as a function of time. A controller of the gradiometer system is adapted to determine at least one vector component of a gradient of the magnetic field sensed by the sensor(s) by carrying out the following: (i) obtaining readout data from the sensor(s) indicative of the magnetic field sensed at the varied sensing positions during a certain measurement time duration; (ii) processing the readout data to determine a differential magnetic field time profile indicating a difference between the magnetic fields sensed at least two of the sensing positions during the measurement time duration; and (iii) demodulating the differential magnetic field time profile in accordance with the displacement function to thereby determine a demodulated time profile indicative of the at least one vector component of the gradient of the measured magnetic field.

General Description

There is a need in the art for a novel and inventive technology for improving the sensitivity, accuracy and robustness of vapor cell-based magnetometers (also known as atomic magnetometers).

In order to provide highly sensitive magnetic field measurements by a magnetometer (e.g., in the scale of pico-tesla), it is preferable to set any electronic component of the magnetometer system, which produces magnetic fields that are not negligible relative to the measurement sensitivity scale, as far as possible from the point of measurement, at which the external/ambient magnetic field is to be measured. In relation to vapor-cell based magnetometers, such an electric component may include for example the light source(s) producing the probe beam, possibly also the pump beam, and possibly also the detector detecting the light beam.

Yet it should be noted that generally obtaining a highly sensitive magnetic field measurement (with improved SNR) requires the probe beam to have a predetermined/steady intensity $I_1$ and predetermined/steady polarization state P1at the input to the vapor cell during the measurement and enable accurate measurement of the magnetic field B. There are various conventional techniques for Larmor Frequency LF probing/detection, based on either the intensity $I_2$ or the polarization state $P_2$, of the probe light beam at the exit from the vapor cell. These techniques will be readily appreciated by those versed in the art and need not be described here in detail. In order to clarify the need for prior stable setting of both the intensity $I_1$ and the polarization state $P_1$ of the probe light beam at its entry to the vapor cell, a non-limiting example of a probing process is hereby discussed. For example, during the probing process, the Alkali-like atoms in the vapor cell are pumped to precess (e.g., via optical and/or electronic/RF pumping). The value the frequency of the precession is the Larmor frequency which corresponds to the magnitude of the magnetic field in the vicinity of the atom. Magnetic resonance transitions can be driven in the atomic ground state by a modulated field at an on-resonance modulation frequency corresponding (synchronized) to the Larmor frequency, and thus, when the optical and/or electronic/RF pumping field are modulated accordingly, the population of the Alkali atoms AA are excited to precess coherently. More specifically, when the modulation frequency corresponds to the Larmor Frequency, a certain ensemble/population of the Alkali-like atoms AA are excited to precess. Therefore, typically, in order to measure the magnetic field B, a pumping field is provided (as said above, it may be via optical pumping or electronic/RF pumping), being modulated at a modulation frequency that is swept/varied over a certain modulation frequency range. During this modulation frequency variation (e.g., at various modulation frequencies of the pumping field), the probe light beam ProbLB is directed to pass through the vapor cell and is detected/measured after it exists the vapor cell to measure its intensity $I_2$ or its polarization state $P_2$.

The probe light beam interacts differently with the Alkali/Alkali-like atoms that do precess at the Larmor Frequency, as compared to Alkali atoms that do not precess. Thus, the population/ensemble of the precessing atoms along the pass of the probe light beam affect its intensity, giving rise to an intensity difference/change $\Delta I = I_1 - I_2$ between the probe light beam's intensity $I_1$ at the entrance to the vapor cell and its intensity $I_2$ at the output therefrom. This intensity difference/change $\Delta I$ is indicative of the population of the precessing Alkali atoms, with which the probe light beam interacts, which is in turn indicative of whether the pumping field is modulated at a frequency corresponding to the Larmor frequency or not.

Moreover, due to the rotational nature of the precession, if the probe light beam includes different circularly-polarized components (e.g. left-circularly-polarized and right-circularly-polarized components), the different circularly-polarized components would interact differently with the precessing atoms, which would result in different relative intensities of the left and right circularly-polarized components of the probe light beam at the exit of the vapor cell, as compared to their relative intensities at the input thereto. Thus, the population of the precessing atoms also affects the polarization state of the probe light beam during its passage through the vapor cell, giving rise to a difference/change $\Delta P = P_1 - P_2$ between the probe light beam's polarization state $P_1$ at its entrance to the vapor cell and its polarization state $P_2$ at the output therefrom.

Thus, determining the Larmor Frequency may be achieved by sweeping/varying the modulation frequency of the pumping field (the optical pumping or RF pumping field) across a range (e.g., covering the Larmor frequency), while monitoring the change in the intensity $\Delta I$ or the change in the polarization state $\Delta P$ of the probe light beam, as affected by its passage through the vapor cell, during this variation of the modulation frequency (e.g., as a function thereof). At the point (particular-modulation-frequency) along the modulation frequency variation, at which the modulation frequency matches/corresponds to the Larmor frequency, the population of the precessing atoms along the probe beam's path is expected to reach an extremum, and, accordingly, at this point point/particular-modulation-frequency, the change in the intensity $\Delta I$ or in the polarization state $\Delta P$ of the probe beam is expected to reach an extremum.

Therefore, the Larmor frequency, and hence the measurement the magnetic field B, may be determined by monitoring how the change in at least one of the intensity $\Delta I$ or the polarization state $\Delta P$ for the probe light beam as it passes within the vapor cell, is varied as a function of the modulation frequency of the pumping field. The modulation frequency at which this change reaches an extremum is generally indicative of the Larmor frequency, and thus of the magnetic field B which is to be measured (e.g., its magnitude). The accuracy of this measurement is however dependent on having predetermined (i.e., stable) values of both the intensity $I_1$ and the polarization state $P_1$ of the probe light beam at the entrance to the vapor cell. This is because the interaction of the probe light beam through its passage in the vapor cell depends on both the intensity $I_1$ of the probe light beam (which is associated with the number of photons of the beam which are likely to interact with and be absorbed by the population of atoms), as well the polarization state thereof $P_1$ (since the rate interaction with the precessing atoms depends on the light polarization, and is different between left and right polarizations). Therefore, variations in any one of the intensity $I_1$ or polarization $P_1$ of the probe light beam at the entrance to the vapor cell, during the measurement (e.g. during the modulation frequency sweeping/variation) introduces errors/inaccuracies to the magnetic field B measurement (since this may affect the location at which the extremum of the change in the intensity $\Delta I$ or the change in the polarization state $\Delta P$ appears with respect to the modulation frequency).

Accordingly, in order to obtain an accurate magnetic field measurement, it is desired that both the intensity and the polarization of the probe light beam at the entrance to the vapor cell remain fixed/predetermined and stable. Additionally, as indicated above, it is desired to place electronic components of the magnetometer system, which produce instrumental magnetic field noises, sufficiently far from the vapor cell, so that their instrumental magnetic field noise at the vapor cell is negligible relative to the measurement sensitivity scale/accuracy. In practice, for example when high measurement accuracy/sensitivity in the order of pico-tesla is sought, this entails placing the light source(s) producing the probe light beam, and possibly the pump light beam (if optical pumping is used), at a distance of a few meters or more (a distance greater than at least one meter) from the point of measurement, the vapor cell.

The conventional techniques are however deficient in fulfilling these two requirements together. Indeed, as will be appreciated by those versed in the art, conveying the light beam(s) from the remote location of the light source(s) to the vapor cell, while maintaining both the intensity and the polarization as stable, may be theoretically possibly (for example utilizing free propagation of the light beam (e.g. laser) from the light source to illuminate the vapor cell), however, in practice, such a setup is not robust, and is prone to failures except if performed in laboratory conditions (e.g. due to various environmental conditions such as temperature-variations, mechanical vibrations of optical elements along the propagation path, and/or contaminants along the path). Likewise, conveying the light beam(s) by utilizing polarization maintaining optical fiber(s) (PMF(s)) extending between the light source(s) and the vapor cell is also not robust, not practical, and prone to failures in non-laboratory conditions. Indeed, although PMF provides good polarization maintenance over short distances (e.g., about less than 1 meter), over larger distances the polarization of a significant part of the light transmitted therethrough is destroyed, thus would hamper the sensitivity of the measurement (this may be caused by various environmental conditions such as mechanical stresses/strains, temperature variations to which the proper functionality of the PMF fiber is susceptible). Indeed, even if one would consider placing a polarizer between the output of a PMF fiber and the vapor cell, to ensure suitable and stable polarization is fed to the vapor cell, in such a setup the partial/non-predetermined and unstable destruction of the polarization of light through the fiber would lead to unstable intensity of light output from the polarizer, and thus in turn also yields reduced sensitivity of the magnetometer. The above affects the robustness of and/or sensitivity and accuracy of the conventional techniques (e.g., since longer fibers are more susceptible to said environmental conditions, while shorter fibers limit the ability to isolate the measurement point (vapor cell) from other electronic components of the system).

The present invention provides a solution to the above indicated problems in the conventional techniques, and therefore facilitates highly accurate vapor cell based magnetic field measurements to be conducted utilizing a probe light beam (and possibly also a pumping light beam) having a stable (predetermined) intensity and polarization at the entrance to the vapor cell, while placing electronic equipment producing substantial magnetic field noise, such as the light source(s), remote from the location vapor cell, at which the magnetic field is measured.

Thus, according to a broad aspect of the present invention there is provided a magnetometer for measuring a magnetic field B in the vicinity thereof. The magnetometer includes:
a vapor cell comprising atomic vapor;
an optical processor for receiving a light beam and directing said light beam, as a probe light beam, to enter the vapor cell with a certain predetermined intensity $I_1$ and a certain predetermined polarization state $P_1$ to serve for interacting with at least one type of Alkali-like atoms in the atomic vapor of the vapor cell, for probing a Larmor frequency of precession thereof; and
a detector for detecting the light beam after interaction with the atomic vapor to generate signals/data indicative of said Larmor frequency.

The optical processor includes an optical depolarizer and a polarizer arranged respectively successively (e.g., not necessarily consecutively) with respect to a propagation direction of said light beam, along a propagation path of the light beam through the optical processor. The optical depolarizer is adapted to depolarize the light beam to yield a depolarized light beam. The polarizer is arranged to polarize the depolarized light beam, to produce said predetermined polarization state $P_1$ of the light beam, thereby forming said probe light beam with said predetermined intensity $I_1$ being a predetermined fraction $\alpha$ of an initial intensity $I_0$ of the light beam and with said predetermined polarization state $P_1$.

It should be noted that in embodiments of the present invention the Alkali-like atoms contained in the vapor cell may include any type of the Alkali metal atoms (e.g. Li, Na, K, Rb, Cs and Fr) and/or helium (He).

In some embodiments of the magnetometer of the present invention, the optical processor is a adapted to output said light beam with said certain predetermined intensity $I_1$ being the predetermined fraction $\alpha$ of said initial intensity $I_0$, $I_1=(\alpha\pm\Delta\alpha)I_0$, whereby $\Delta\alpha$ designates an uncertainty of deviation of said predetermined intensity $I_1$ from a nominal value thereof relative to said initial intensity $I_0$. The optical coupler is configured and operable such that the uncertainty of deviation does not exceed: $\Delta\alpha \leq 10\%$, regardless of an initial polarization state $P_0$ of said light beam when entering said optical processor 120, to thereby facilitate accurate determination of the Larmor frequency of precession based on the light captured by said detector.

In some embodiments of the magnetometer of the present invention, the probe light beam is a monochromatic light beam with wavelength $\Lambda$ matching one or more fine-structure absorption lines of the Alkali-like atoms. For example, the one or more fine-structure absorption lines include at least one of a D1 and D2 line of the Alkali-like atoms. The monochromatic light beam may, for example, extend over a narrow spectral linewidth $\Delta\nu$ smaller than a shortest separation between two adjacent hyperfine structure transitions of said fine-structure absorption lines of the Alkali-like atoms, to thereby improve a signal to noise ratio (SNR) of light indicative of said Larmor precession captured by said detector.

In some embodiments of the magnetometer of the present invention, the optical processor is adapted to direct said probe light beam to propagate to said vapor cell as a monochromatic polarized light beam having a narrow cross-sectional area, preferably not exceeding $A \leq 80$ mm$^2$, thereby efficiently producing said probe light beam with a high flux density $F_1 \geq I_1/A \equiv (\alpha\pm\Delta\alpha)I_0/A$. The high flux density $F_1$ thereby facilitates an efficient interaction of the probe light beam with the Alkali-like atoms, and thereby improves a signal to noise ratio (SNR) of detection of light indicative of said Larmor frequency of precession by said detector.

In some embodiments of the magnetometer of the present invention, the depolarizer includes a pseudo-random, or random, spatial pattern retarder 122.1 configured and operable for spatially randomizing the polarizations of different cross-sectional regions within a cross-sectional area A of the light beam. For example, the spatial pattern retarder provides for depolarizing said light beam to a degree of polarization (DoP) equal or lesser than DoP≤10% when polarizing a narrow monochromatic light beam having wavelength band within the range of $[\lambda \pm \Delta\lambda/2]$ where $\Delta\lambda$ is a full width at half maximum of the wavelength band, does not exceed $\Delta\lambda \leq 1.33$ femto-meter, and at least one of a cross-sectional area A or a diameter D of the beam does not exceed A≤19.6 mm² or D≤5 mm respectively. —The spatial pattern retarder may, for example, include a layer of liquid crystal polymer (LCP).

It is noted that in some embodiments of the magnetometer of the present invention, the polarizing effect of the polarizer causes attenuation of the light beam passing through the polarizer, by a polarization filtering factor $\alpha_{pol}=0.5*\pm0.5*1\alpha_{pol}$ whereby an uncertainty $\Delta\alpha_{pol}$ in the polarization filtering factor $\Delta\alpha_{pol}$ is given by a degree of polarization (DOP) of the light beam output from said depolarizer, $\Delta\alpha_{pol}$=DoP. Accordingly, the obtained predetermined intensity $I_1$ of the light beam is a predetermined fraction $\alpha$ of the initial intensity $I_0$, such that $I_1=(\alpha\pm\Delta\alpha)I_0\equiv(\alpha_{a/s}\pm\Delta\alpha_{a/s})(\alpha_{pol}\pm\Delta\alpha_{pol})I_0$ (whereby $\alpha_{a/s}$ and $\Delta\alpha_{a/s}$ are respectively an absorption/scattering attenuation factor of the light beam absorption and/or scattering through the optical processor, and $\Delta\alpha_{a/s}$ is a negligible uncertainty in the absorption/scattering attenuation factor $\alpha_{a/s}$, $\Delta\alpha_{a/s}/\alpha_{a/s}\sim 0$). Thus, the maximal deviation $\Delta\alpha$ in the certain predetermined intensity $I_1$ of the light beam relative to the initial intensity $I_0$ of the light beam through the optical processor, is given by $I_1/I_0=(\alpha\pm\Delta\alpha)\approx\alpha_{a/s}(\alpha_{pol}\pm\Delta\alpha_{pol})$, and the uncertainty in a maximal deviation of the output intensity $I_1$ relative to the initial intensity $I_0$ substantially does not exceed the degree of polarization (DOP) of the light beam output from said depolarizer.

In some embodiments of the present invention, the magnetometer is configured for being distanced from a light source (e.g., a laser) producing the light beam by a distance of one or more meters d≥1 m to thereby reduce effects of electromagnetic fields produced by electronics of said light source from affecting measurement of said magnetic field B by said magnetometer. For instance, the magnetometer may be associated with an optical fiber extending between said light source and an optical input of said optical coupler for propagating said light beam to the vapor cell (e.g., to the optical coupler of the magnetometer). Thus, the length of said optical fiber is generally greater than, or equal to the distance of the one or more meters d≥1 m. It is noted that the optical fiber need not maintain polarization of light over this length as the optical coupler obviates a need for the fiber to be configured or function as a polarization maintaining fiber (PMF). In some embodiments of the present invention, optical fiber is a single mode fiber (SMF), thereby providing that said light beam, when exiting said fiber, has a more uniform direction of propagation and/or a more uniform spatial intensity distribution as compared to a multimode fiber of similar length. This thereby improves a signal to noise ratio (SNR) of detection of light indicative of said Larmor frequency of precession by the detector.

It should be noted that the fiber, the light source, or both, may be included as part of the magnetometer. In some implementations the fiber is part of the optical coupler, which couples the light source to the vapor cell.

In some embodiments, the magnetometer of the present invention is configured as an all-optical magnetometer. The at least one type of Alkali-like atoms are excited by a pumping light beam, thereby avoiding adverse effects of electromagnetic fields produced by electronic pumping/excitation of the Alkali-like atoms from affecting measurement of said magnetic field by said magnetometer. In such embodiments for example, a single light beam may serve as both the pumping light beam and the probe light beam, and the magnetometer may be, for example, configured with a Bell-Bloom optical setup. Alternatively, all-optical implementations may also be embodied with separate pumping and probe light beams.

In all-optical magnetometer embodiments of the present invention, the pumping light beam is preferably circularly polarized in order to improve efficiency of excitation of said Alkali-like atoms thereby. In some embodiments, the pumping light beam is directed to pass through a certain optical processor prior to its entrance to the vapor cell, including an optical depolarizer and a polarizer arranged respectively successively with respect to a propagation direction of the pumping light beam. The certain optical processor may be the optical processor used for the probe beam, or another optical processor.

In some embodiments, the magnetometer of the present invention is configured and operable for probing precession of said Alkali-like atoms utilizing a free induction decay (FID).

In some embodiments of the magnetometer of the present invention, at least one of a frequency, amplitude or polarization of the pumping light beam is modulated at a modulation frequency.

In some embodiments of the magnetometer of the present invention, the detector includes a photodetector capable of detecting a final intensity $I_2$ of the probe light beam after its passage through the vapor cell. The difference between the predetermined intensity $I_1$ the probe light beam at the entrance to the vapor cell and the final intensity $I_2$ is indicative of a Larmor precession frequency of the type of Alkali atoms in the vapor cell.

In various embodiments of the magnetometer of the present invention, the predetermined polarization state $P_1$ of the probe light beam at the entrance to the vapor cell may be linear polarization, circular polarization, or elliptical polarization. Preferably, in some cases, the predetermined polarization state $P_1$ of the probe light beam is in circular polarization, in order to improve the rate of interaction of said probe light beam with precessing Alkali atoms.

In some embodiments of the magnetometer of the present invention, the detector comprises a polarimeter capable of detecting data indicative of a change in a state of polarization of probe light beam between its predetermined initial polarization state $P_1$ and the output/final polarization state $P_2$ after interaction of the probe light beam with the atomic vapor in said vapor cell. The change of state of polarization of the probe light beam is indicative of a Larmor precession frequency of said type of Alkali-like atoms. For example, the polarizer may be a linear polarizer, to thereby provide that predetermined linear polarization state $P_1$ at the entrance to the vapor cell including left and right circularly polarized components of the probe light beam. The polarimeter is capable of detecting a difference between the interaction of the left and right circularly polarized components of the probe light beam with the Alkali-like atoms in the vapor cell, whereby said difference is indicative of the Larmor frequency of their precession. The polarimeter may, for example include a differential polarimeter.

In some embodiments of the present invention, the magnetometer is adapted to sweep/vary the frequency of the modulation of the pumping light beam over a range of frequencies, and said detector determines a variation in the difference between said predetermined polarization state $P_1$ and said output polarization state $P_2$ or a variation in the difference between said predetermined intensity $I_1$ and said final intensity $I_2$, as a function of the frequency of the modulation within the swept varied range of frequencies. The magnetometer then identifies the Larmor frequency, which is indicative of the magnetic field that is to be measured, by identifying an extremum point in said varied difference (between the intensities or between polarization) as a function of the varied modulation frequency.

For instance, in such embodiments the magnetometer may include:
- a modulator capable of modulating said light beam with modulation frequencies within said range, and to output a modulation signal/data indicative of the modulation frequency by which the pumping light beam is modulated;
- a lock-in module adapted to receive the modulation signal/data from the modulator, and connectable to said detector to receive an output detection signal/data thereof; whereby said lock-in module is configured and operable to filter said detection signal/data according to the modulation frequency indicated by said modulation signal/data, and thereby determine at least one of said final intensity $I_2$ or said output polarization state $P_2$ of the probe light beam detected by said detector at said modulation frequency; and
- a controller adapted for sweeping/varying the frequency of the modulation over said range of frequencies.

The controller may be adapted to carry out the following at each modulation frequency of one or more modulation frequencies within the range:
- operate said modulator to modulate said pumping light beam with said modulation frequency;
- obtain the final intensity $I_2$ or said output polarization state $P_2$ of the probe light beam corresponding to said at least one modulation frequency of the pumping light beam;
- determine a difference between said final intensity $I_2$ or said output polarization state $P_2$ and respectively said predetermined intensity $I_1$ or said predetermined polarization state $P_1$, of the probe light beam;

The controller may thereby determine the Larmor frequency, based on the difference as determined for the one or more modulation frequencies.

In some embodiments of the magnetometer of the present invention, the detector is associated with an optical collection assembly including one or more optical fibers adapted for receiving the light beam after passage through the vapor cell and coupling said light beam to the detector, whereby the detector is displaced from the vapor cell. For example, the magnetometer may be configured as an all-optical magnetometer, and the detector may be displaced from the vapor cell such that instrumental magnetic field noise from the detector, at said vapor cell, is below a designated magnetic field measurement sensitivity to be obtained by the magnetometer system. The detector may be, for example, displaced by a distance of at least 1 meter. To this end, in some embodiments the one or more optical fibers associated with the detector include any one or more of the following fiber types: polarization maintaining fibers, single-mode fibers, or multi-mode fibers.

According to another broad aspect of the present invention there is provided a Bell-Bloom type magnetometer for measuring a magnetic field B in the vicinity thereof. The magnetometer includes:
- a vapor cell comprising atomic vapor;
- an optical processor for receiving a light beam and directing said light beam as a monochromatic light beam of wavelength A matching absorption lines of at least one type of Alkali-like atoms in the atomic vapor, for interacting with said at least one type of Alkali-like atoms, to function as both a pumping light beam and/or a probe light beam;
- A detector for detecting the light beam after interaction with the atomic vapor to generate signals/data indicative of said Larmor frequency; and
- a controller;

In order for the light beam to function as the pumping light beam, the light beam provides a flux F of modulated light modulated at a modulation frequency. The modulation may be a modulation of at least one of a frequency, intensity, or polarization of the pumping light beam, such that when the modulation frequency matches the Larmor frequency, the flux excites magnetic transitions in a population of said atoms along the path of the beam, thereby being at least partially absorbed while causing atom magnetic moments of said population to precess with Larmor frequency $f_L = \gamma B$ according to the magnetic field B, which is to be measured. Additionally, in order for the light beam to function as a probe light beam, the light beam is directed with a certain predetermined intensity $I_1$ and certain predetermined polarization state $P_1$ to pass through and interact with the population of alkali atoms, and to be detected by the detector, which detects data indicative of at least one of a final intensity $I_2$ and/or a final polarization state $P_2$ of the light beam after interaction with the population of atoms.

The controller is adapted for sweeping/varying a frequency of the modulation of the pump light beam over said range of frequencies, and obtain the final intensity $I_2$ or said final/output polarization state $P_2$ of the probe light beam detected by said detector at each modulation frequency, to measure, for each modulation frequency, at least one difference of the following:
- an intensity difference $I_2 - I_1$ between the output/final intensity $I_2$ and said predetermined intensity $I_1$, whereby said intensity difference is indicative of the absorbance of the light beam by the population of atoms while exciting them to precess;
- a polarization difference $P_2 - P_1$ between said output/final polarization state $P_2$ and said predetermined polarization state $P_1$, whereby said polarization difference is indicative of interaction of said light beam with atoms' magnetic moment of said population precessing at the Larmor frequency, which causes a change in the polarization (spin polarization) state of the atoms (e.g. due to the Faraday Effect);

The controller thereby enables to determine data indicative of said magnetic field B by identifying the Larmor frequency, which is proportionate to the magnetic field B, as the modulation frequency at which said at least one difference is extremal (e.g., maximal).

In some embodiments, the signal to noise ratio in the measurement of said difference is improved by the following configurations:
a. sufficient displacement of an electronic components of a light source producing said light beam from the vapor cell, such that magnetic field noise from said electronic component is reduced in the vicinity of the atoms which are to be excited;
b. sufficient flux of said light beam to improve efficiency of said pumping and increase the population of atoms in which magnetic dipole transitions are excited by the light beam;
c. accurate determination of said certain predetermined intensity $I_1$ and said certain corresponding predetermined polarization state $P_1$ to enable determination of said at least one difference with sufficient sensitivity.

The optical processor comprises an optical fiber for connecting the optical processor to the light source, wherein said light source provides a light beam of initial intensity $I_0$ and is distanced with said sufficient displacement, to thereby reduce said magnetic field noise. Considering that the polarization state of the light beam is prone to deteriorate over a said optical fiber length due to birefringence in fiber (which can be caused by temperature variations or/and mechanical stress and/or manufacturing defects over the fiber), the optical processor also includes an optical assembly for receiving and optically processing the light beam output from the fiber to adjust its certain predetermined intensity $I_1$ and said certain predetermined polarization state $P_1$ with accuracy, while maintaining the light beam with a relatively small cross-section A such that the light beam entering the vapor cell has at least said sufficient flux $F_1=I_1/A$. The optical assembly includes an optical depolarizer and a polarizer arranged respectively successively with respect to a propagation direction of said light beam along a propagation path thereof through the optical assembly of the optical processor. The optical depolarizer is adapted to scramble (e.g., spatially smear) and depolarize the light beam to yield a depolarized light beam with a reduced degree of polarization DOP and with a predetermined intermediate intensity $I'=(\alpha_{a/s})I_0$ whereby $\alpha_{a/s}$, when passing through at least the optical fiber of said optical processor. The polarizer is arranged to polarize the depolarized light beam, to produce said predetermined polarization state $P_1$ of the light beam, thereby forming said light beam with said predetermined intensity $I_1$ being a predetermined fraction $\alpha_{pol}=0.5^*\pm0.5^*DOP$ of the intermediate intensity: $I_1=\alpha_{pol}'=\alpha_{pol}(\alpha_{a/s})I_0=(0.5^*\pm0.5^*DOP)(\alpha_{a/s})I_0$ whereby the degree of polarization DOP provided by said depolarizer introduced an uncertainty $\Delta\alpha_{pol}$ to the intensity $I_1$ of the light beam output from said optical coupler towards said vapor cell. The depolarizer comprises a pseudo-random, or random, spatial pattern retarder, which is configured and operable for spatially randomizing the polarizations of different cross-sectional regions within the small cross-sectional area A of the monochromatic light beam to yield said intermediate light beam with a degree of polarization off less than DoP<10%, thereby improving the accuracy of the predetermined intensity $I_1$ of the monochromatic light beam with said predetermined polarization state $P_1$ entering the vapor cell and improving a signal to noise ratio of said measurement.

According to another broad aspect of the present invention there is provided an optical processor configured for receiving a light beam of a certain initial intensity $I_0$ and undetermined polarization $P_0$ as an input, and processing said light beam to output said light beam with a certain predetermined intensity $I_1$ relative to said initial intensity $I_0$ and certain predetermined polarization state $P_1$. The optical processor includes an optical depolarizer and a polarizer arranged respectively successively (e.g., not necessarily consecutively) with respect to a propagation direction of said light beam, along a propagation path of the light beam through the optical processor. The optical depolarizer is adapted to depolarize the light beam to yield a depolarized light beam. The polarizer is arranged to polarize the depolarized light beam, to produce said predetermined polarization state $P_1$ and said certain predetermined relative intensity $I_1$ of the light beam output of said optical processor.

In some embodiments of the optical processor, the certain predetermined intensity $I_1$ is a predetermined fraction $\alpha$ of the initial intensity $I_0$, $I_1=(\alpha\pm\Delta\alpha)I_0$, whereby $\Delta\alpha$ designates an uncertainty of deviation of said predetermined intensity $I_1$ from a nominal value thereof relative to said initial intensity $I_0$. The optical coupler 120 is configured and operable such that the uncertainty of deviation does not exceed: $\Delta\alpha\leq10\%$, regardless of an initial polarization state $P_0$ of said light beam when entering said optical processor.

In some embodiments the light beam processed by the optical processor is a monochromatic light beam. Alternatively, or additionally, in some embodiments the light beam is designated to pass through a narrow cross-sectional area $A\leq80$ mm$^2$ of the depolarizer.

In some embodiments, the depolarizer includes a pseudo-random, or random, spatial pattern retarder configured and operable for spatially randomizing the polarizations of different cross-sectional regions within a cross-sectional area A of the light beam. For example, the pseudo-random, or random, spatial pattern retarder, may include a spatial distribution of at least 40 regions of various retardation properties randomly or pseudo randomly arranged across cross-sectional area of $<=1$ mm$^2$. For example, the spatial pattern retarder may comprise a layer of liquid crystal polymer (LCP).

The spatial pattern retarder may be adapted to provide for depolarizing the light beam to a degree of polarization (DOP) equal or lesser than DOP$\leq10\%$ when depolarizing a narrow monochromatic light beam having wavelength band within the range of $[\lambda\pm\Delta\lambda/2]$ where $\Delta\lambda$ being a full width at half maximum of the wavelength band, does not exceed $\Delta\lambda\leq1.33$ femto-meter ($\Delta f<500$ MHz), and diameter D of the beam does not exceed $D\leq10$ mm.

In some embodiments of the optical processor, a polarizing effect of the polarizer causes attenuation of the light beam passing through the polarizer, by a polarization filtering factor $\alpha_{pol}=0.5^*\pm0.5^*1\alpha_{pol}$ whereby an uncertainty $\Delta\alpha_{pol}$ in the polarization filtering factor $\Delta\alpha_{pol}$ is given by a degree of polarization (DOP) of the light beam output from said depolarizer, $\Delta\alpha_{pol}=DoP$.

In some embodiments, the optical processor is configured as an all-optical processor, having no electric components. Alternatively, or additionally, the optical processor may include one or more adaptive optical components.

According to yet another broad aspect of the present invention, there is provided a method for optical processing of a light beam to yield the light beam with a certain predetermined intensity $I_1$ relative to its initial intensity $I_0$ and with certain predetermined polarization state $P_1$. The method includes:
  providing a light beam having a certain initial intensity $I_0$ and undetermined polarization $P_0$;
  depolarizing said light beam to yield said light beam with a certain intermediate intensity relative and substantially un-polarized polarization state;
  subsequent to said depolarizing, polarizing said light beam to yield said predetermined polarization state $P_1$ and said certain predetermined relative intensity $I_1$.

The method according to this aspect of the present invention may be configured as an all-optical processing method.

In some embodiments, the predetermined intensity $I_1$ is a predetermined fraction $\alpha$ of the initial intensity $I_0$, $(\alpha\pm\Delta\alpha)I_0$, whereby $\Delta\alpha$ designates an uncertainty of deviation of said predetermined intensity $I_1$ from a nominal value thereof relative to said initial intensity $I_0$. To this end the method is operable, such that the uncertainty of deviation does not exceed: $\Delta\alpha\leq10\%$, regardless of an initial polarization state $P_0$ of the light beam.

In some embodiments of the method, the depolarizing is performed utilizing a pseudo-random, or random, spatial pattern retarder configured and operable for spatially randomizing the polarizations of different cross-sectional regions within a cross-sectional area A of the light beam.

In some embodiments, the method is adapted to operate with said light beam being a monochromatic light beam. Alternatively, or additionally, the method may be adapted to operate with said light beam having a narrow cross-sectional area $A \leq 80$ mm$^2$. In some embodiments of the method, the depolarizing yields a degree of polarization (DOP) equal or lesser than DOP$\leq$10% when depolarizing a narrow monochromatic light beam having wavelength band within the range of $[\lambda \pm \Delta\lambda/2]$ where LA being a full width at half maximum of the wavelength band, does not exceed $\Delta\lambda \leq 1.33$ femto-meter, ($\Delta f < 500$ MHz), and diameter D of the beam does not exceed D$\leq$10 mm.

In some embodiments of the method, the polarizing affects attenuation of the light beam by a polarization filtering factor $\alpha_{pol} = 0.5^* \pm 0.5^* \Delta\alpha_{pol}$ whereby an uncertainty $\Delta\alpha_{pol}$ in the polarization filtering factor $\Delta\alpha_{pol}$ is given by a degree of polarization (DOP) of the light beam after said depolarizing, $\Delta\alpha_{pol}$=DoP.

According to yet another broad aspect of the present invention there is provided a method for magnetic field measurements. The method includes:
providing a light beam for probing a vapor cell to determine a Larmor frequency of precession of atomic vapor therein, whereby said light beam is provided from a remote optical source displaced from said vapor cell (e.g., a distance of at least 1 meter), and has a certain predetermined initial intensity $I_0$ and undetermined initial polarization $P_0$;
optically processing said light beam, at a location adjacent to said vapor cell (e.g., located at a distance much smaller than 1 meter from the vapor cell) to yield said light beam with a certain predetermined intensity $I_1$ relative to said initial intensity $I_0$ and certain predetermined polarization state $P_1$, by:
  a. depolarizing said light beam to yield said light beam with a certain intermediate intensity and substantially un-polarized polarization state; and
  b. subsequent to said depolarizing, polarizing said light beam to yield said predetermined polarization state $P_1$ and said certain predetermined relative intensity $I_1$;
subsequent to said optical processing, directing said light beam to pass within the vapor cell and interact with the atomic vapor therein for probing a Larmor frequency of precession thereof; and
detecting at least one of a final polarization state $P_2$ and a final intensity $I_2$ of said light beam after interaction with the atomic vapor after and utilizing said at least one of the final polarization state $P_2$ and the final intensity $I_2$ to determine the Larmor frequency of precession of the atomic vapor.

In some implementations, the optical processing is carried out according to the optical processing method as described above and in more detail below.

According to further another broad aspect of the present invention there is provided a spatially distributed magnetometer array/network. The network/array includes a plurality of magnetometers for measuring a magnetic field B in respective vicinities thereof. Each magnetometer of one or more magnetometers of the plurality of magnetometers includes:

a respective vapor cell of the magnetometer, which contains atomic vapor;
a respective optical coupler for optically coupling between a light source providing a respective light beam for the magnetometer, and the vapor cell of the magnetometer;

The spatially distributed magnetometer network/array includes:
a reference data provider (e.g., data storage or a network communication module or one or more sensors) capable of providing data indicative of optical attenuation properties of the respective optical couplers of said one or more magnetometers; and
one or more intensity adjustment modules, associated respectively with said one or more magnetometers, and respectively capable of adjusting the intensities $I_1$ of the respective light beams of the magnetometers such that at the entrance to the corresponding vapor cells 110 of the magnetometers (e.g. at the outputs from the corresponding optical couplers) the light beams have certain predetermined intensities $I_1$;
at least one controller connectable to said one or more intensity adjustment modules and configured and operable for operating the one or more intensity adjustment modules according to the optical attenuation properties of the respective optical couplers of the magnetometers associated respectively therewith, to thereby yield said certain predetermined intensities $I_1$ at the entrance to the vapor cells.

At least one of the light couplers, which is associated with a respective magnetometer of said magnetometers, includes an optical processor configured and operable according to the present invention as described above and, in more detail, below. The optical processor is adapted for receiving the respective light beam of the respective magnetometer, such that it has a certain initial intensity $I_0$ and undetermined polarization $P_0$ and processing the light beam to yield/output the light beam with a certain predetermined polarization state $P_1$ and an intensity $I_1$ relative to said initial intensity $I_0$ by an attenuation factor $\alpha$, $I_1 \approx \alpha I_0$.

In some embodiments, the respective optical attenuation properties of at least some of the light couplers 170 of the spatially distributed magnetometer network/array include compensation for the attenuation factor $\alpha$ of the optical processor.

Alternatively or additionally, in some embodiments where the light couplers 170 include respective optical assemblies (e.g. including one or more optical components along a light propagation path from the light source to the respective vapor cell), the respective optical attenuation properties of the light couplers are associated with the optical attenuation of the optical components of the optical assemblies (e.g. at least for compensation over the attenuation of the optical components which have a relatively substantial attenuation).

For example, in some embodiments, the optical assemblies of one or more of the light couplers 170 include respective optical fibers 140 for propagating respective light beams along at least a part of the light propagation path from the at least one light source to the respective vapor cell. Accordingly, the optical attenuation properties of the at least some of the light couplers 170 may be associated with, or include the attenuation properties of these fibers respectively (e.g. the optical attenuation properties may be indicative of the respective lengths of said fibers).

In some embodiments, the intensity adjustment modules of the spatially distributed magnetometer network/array are each configured and operable for adjusting at least one of the certain initial intensity $I_0$ and their output intensity $I_1$ to obtain said certain predetermined intensity $I_1$ in the respective light beam, at the entrance to their respective vapor cells 110.

The controller of the spatially distributed magnetometer network/array may be configured and operable for operating the intensity adjustment modules such that the certain predetermined intensities of the light beams are adjusted to a certain similar predetermined intensity $I_1$ for a plurality of the magnetometers. This thereby provides that accurate comparable values of the magnetic field B measurements are obtained by the plurality of magnetometers.

In some implementations, one or more of the magnetometers of the spatially distributed magnetometers network are All-Optical magnetometers. For example, one or more of the magnetometers may be configured and operable as Bell-Bloom magnetometers. Alternatively, or additionally, for example, one or more of the magnetometers may be magnetometers configured and operable according to the present invention as described above and in more detail below.

Specifically, in some embodiments, all the magnetometers of the network may be similar magnetometers configured in at least one of the following configurations:
a. all optical magnetometers;
b. Bell-Bloom magnetometers;
c. magnetometers configured and operable according to the present invention as described above, and in more detail, below.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 2A and 2B are respectively front and perspective views of a random/pseudo-random spatial pattern retarder used as a depolarizer in a magnetometer system according to some embodiments of the present invention;

FIG. 3 is a graphical comparison between the depolarizing properties obtainable with the random/pseudo-random spatial pattern retarder, as compared those obtainable by wedge depolarizer, which make the use of a random/pseudo-random spatial pattern retarder specifically advantageous for incorporation as a depolarizer in the magnetometer system of the present invention;

FIG. 6A is a block diagram schematically illustrating an optical processor according to an embodiment of the present invention;

FIG. 6B is a flow chart of an optical processing method according to an embodiment of the present invention.

DETAILED DESCRIPTION OF EMBODIMENTS

Figure 1:
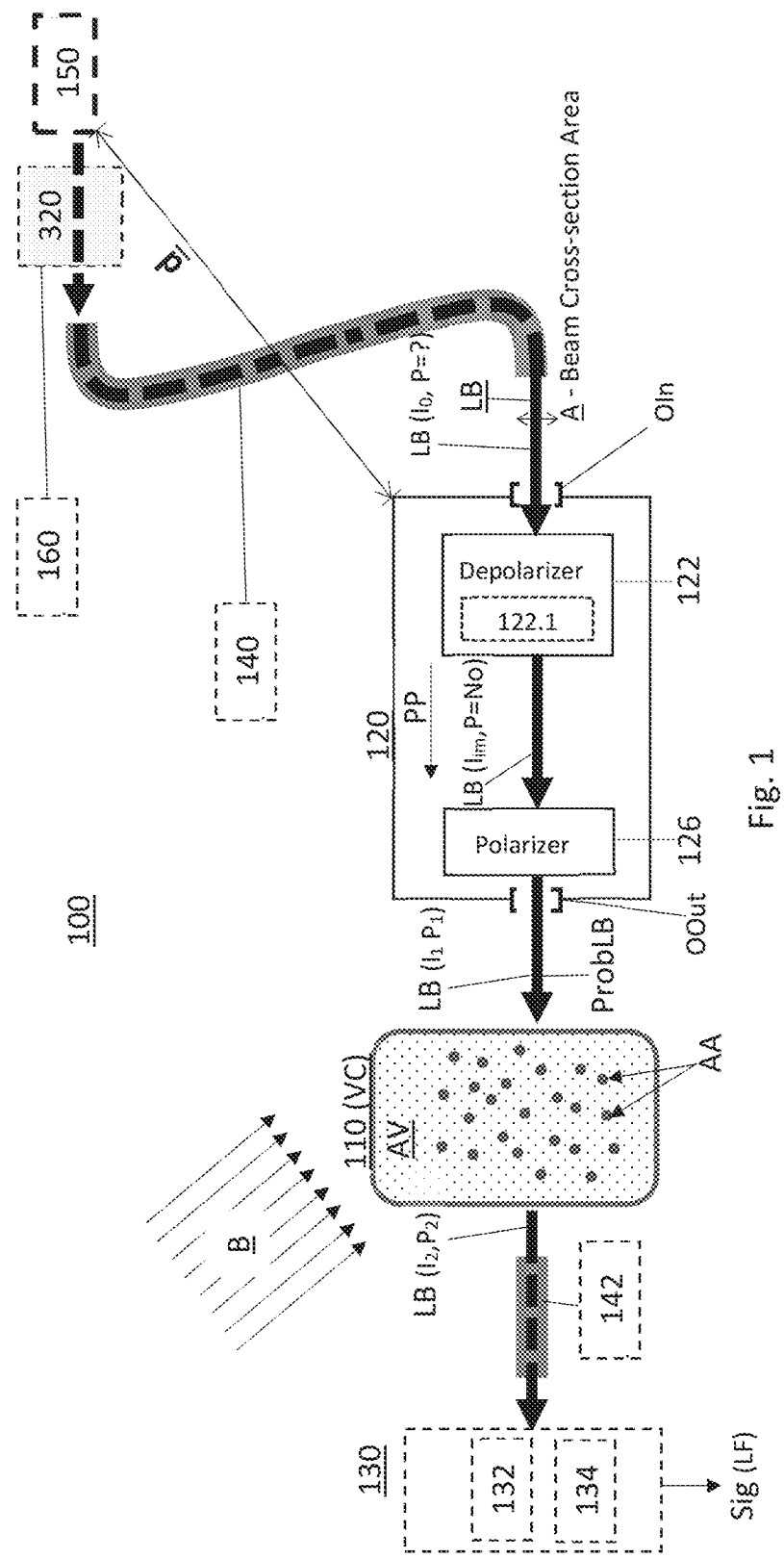
FIG. 1 is a block diagram schematically illustrating a magnetometer system according to an embodiment of the present invention.

Reference is now made to FIG. 1 schematically illustrating a magnetometer system 100 for measuring an external magnetic field B in the vicinity thereof, according to an embodiment of the present invention.

The term external magnetic field B, which is also referred to herein interchangeably just as the magnetic field B is used herein to indicate the magnetic field B which is to be measured by the magnetometer system 100, as opposed to an instrumental magnetic field (being noise), which may be produced by the magnetometer system 100.

The magnetometer system 100 includes a vapor cell 110 (VC) including atomic vapor AV, an optical processor 120 located adjacent to the vapor cell 110 (e.g., typically a distance not more than about 20 centimeters) and optically coupled thereto. The optical processor 120 is configured and operable for receiving an incoming light beam $LB(I_0, P=?)$ of predetermined/stable intensity $I_0$ and not necessarily stable/predetermined polarization P, and optically processing the light beam to output a light beam $LB(I_1, P_1)$ of stable/predetermined intensity $I_1$ and stable/predetermined polarization $P_1$, such that the output light beam $LB(I_1, P_1)$ is suitable to function as a probe light beam for probing a vapor cell 110. The output light beam $LB(I_1, P_1)$ is thereafter directed to enter the vapor cell 110, and the magnetometer system 100 includes a detector 130 for detecting the light beam LB after interaction with the atomic vapor AV in the vapor cell 110 and, responsive to said detection, generates signals/data indicative of a Larmor frequency LF of precession of at least one type of Alkali-like atoms AA in the atomic vapor AV.

In general, as will be readily appreciated by persons of ordinary skill in the art, any one of various known techniques, such as optical pumping or electronic pumping (e.g., via generation of RF fields in the region of the vapor cell) may be used to pump Alkali-like atoms AA to energy levels, at which they precess with the Larmor frequency LF corresponding to the magnetic field B which is to be measured in their vicinity.

Probing of the Larmor frequency LF of the precessing Alkali-like atoms AA is performed optically by utilizing at least a portion, referred to herein as the probe light beam ProbLB, of the light beam LB that exits the optical processor 120. In this regard it is noted that, optionally in some embodiments where optical pumping is utilized (see for instance FIG. 5), the light beam LB processed by the optical processor 120 may include another part/component, being a pumping light beam component, in addition to the component of the light beam LB (typically the properties of pumping light beam component are distinct from the probe light beam ProbLB, e.g. differently modulated, so that it or its effects can be distinguished from those of the probe light beam ProbLB and it does not interfere with the measurement/probing of the Larmor frequency LF by the probe beam). In other embodiments where either optical pumping (see for instance FIG. 4 or 5) or electromagnetic/RF pumping are used, the light beam LB processed by the optical processor 120 may include only the probe light beam ProbLB component.

As indicated above, obtaining accurate magnetic field measurement may require that the probe beam (i.e., the light beam LB or at least its probe light beam component ProbLB) has a predetermined/steady intensity $I_1$ and predetermined/steady polarization state $P_1$ at the input to the vapor cell 110 in order to achieve improved SNR and enable accurate measurement of the magnetic field B. This is, for example because both the intensity $I_1$ and the polarization state $P_1$ of the probe light beam ProbLB should remain stable/fixed at the entry to the vapor cell 110, during the modulation frequency sweeping/variation of the pumping field.

As indicated above, the probe light beam ProbLB interacts differently with the precessing Alkali-like atoms AA as compared to those who do not precess. Accordingly, an intensity difference/change $\Delta I = I_1 - I_2$ between the probe light beam's intensity $I_1$ at the entrance to the vapor cell and its intensity $I_2$ at the output therefrom, is indicative of the population of the precessing atoms with which the probe light beam ProbLB interacts along its path through the vapor cell. Moreover, due to the rotational nature of the precession, in case the probe light beam ProbLB includes different circularly-polarized components (e.g. left-circularly-polarized and right-circularly-polarized components), the different circularly-polarized components thereof would also interact differently with the precessing Alkali-like atoms as compared to their interaction with non-precessing Alkali atoms, and, in this case, a difference/change $\Delta P = P_1 - P_2$ between the probe light beam's polarization state $P_1$ at its entrance to the vapor cell and its polarization state $P_2$ at the output therefrom, would be affected by the population of the precessing atoms with which the probe beam interacts along its path through the vapor cell. Accordingly, a polarization difference/change $\Delta P = P_1 - P_2$ between the probe light beam's polarization state $P_1$ at the entrance to the vapor cell and its polarization state $P_2$ at the output therefrom, may be indicative of the population of the precessing atoms with which the probe light beam ProbLB interacts.

Thus, measuring the Larmor frequency LF may be achieved by sweeping/varying the modulation frequency of the pumping field (the optical pumping or RF pumping field) across a modulation frequency range, and monitoring the population of the precessing atoms by detecting the change $\Delta I$ in the intensity or the change $\Delta P$ in the polarization state of the probe light beam during the modulation frequency sweeping/variation. At the particular-modulation-frequency at which this change in the intensity or polarization state takes place, $\Delta I$ or $\Delta P$ is extremal, which is indicative of the Larmor frequency (since, at this modulation frequency, the pumping field is on-resonance with the Larmor frequency, this exciting magnetic resonance transitions the Alkali-like atoms and increases the population of the precessing atoms). Therefore, in order to determine the Larmor frequency and hence measure the magnetic field B, the change in at least one of the intensities $\Delta I$ or the polarization state $\Delta P$ for the probe light beam should be measured as a function of the modulation frequency of the pumping field (optical pumping or electronic/RF), and the modulation frequency at which this change reaches extremum is indicative of the Larmor frequency. This is in turn indicative of the magnetic field B which is to be measured (e.g., its strength).

Accordingly, as indicated above, the accuracy of the measurement of the magnetic field is dependent on having predetermined (i.e. stable) values of both the intensity $I_1$ and the polarization state $P_1$ of the probe light beam at the entrance to the vapor cell 110 so that the variation in monitored change, in either the intensity or polarization state, $\Delta I$ or $\Delta P$, as a function of the modulation frequency of the pumping, can be attributed to the modulation frequency, and not to some instability in the intensity and/or polarization state of the probe light beam, $I_1$ and/or $P_1$, at the entrance to the vapor cell.

Therefore, the optical processor 120 of the magnetometer system 100 of the present invention is adapted to receive at its input optical port OIn, a light beam LB($I_0$,P=?) of stable/predetermined intensity $I_0$ (stable/predetermined at least up to a certain accuracy of +40%) and output from its output optical port OOut the light beam LB($I_1$,$P_1$) with stable/predetermined intensity $I_1$ (predetermined up to about the similar accuracy as the input intensity) and stable/predetermined polarization $P_1$. The optical processor 120 includes an optical depolarizer 122 and a polarizer 126 arranged respectively successively (e.g., not necessarily consecutively) with respect to a propagation direction of the light beam LB, along a propagation path PP of the light beam through the optical processor 120 (i.e., from its input and output optical ports, OIn and OOut). The optical depolarizer 122 is adapted to depolarize the light beam to yield a substantially depolarized light beam LB($I_{im}$, P=No) with certain intermediate intensity (which may be for instance similar to the input intensity $I_0$ or attenuated by a certain factor, e.g. due to elements of the optical processor 120. The polarizer 126 is arranged to polarize the depolarized light beam LB($I_{im}$, P=No), to produce the predetermined polarization state $P_1$ of the light beam LB($I_1$, $P_1$) at the output optical port OOut. Thus, the light beam LB($I_1$, $P_1$) at the output optical port OOut has the predetermined polarization state $P_1$ as affected by the polarizer 126, and a predetermined intensity $I_1$ being a predetermined fraction $\alpha$ of an initial intensity $I_0$ of the light beam LB($I_0$, $P_0$=?). Generally, the predetermined intensity $I_1$ of the light beam LB($I_1$, $P_1$) at the output is about half of the input intensity due to the polarizer 126 filtering out about half of the unpolarized light LB($I_{im}$, P=No) (plus some additional typically relatively small attenuation of the light beam which may also take place when the light beam propagates through the optical coupler).

To this end, as indicated above, in order to function as a probe light beam, and enable measurement of the Larmor frequency of precession LF and thereby measure the magnetic field B with accuracy, the light beam LB directed to enter and probe the vapor cell 110 by interacting with the Alkali-like atoms AA, should be set to a certain predetermined/stable intensity $I_1$ and a certain predetermined/stable polarization state $P_1$ (e.g. stable during the time the modulation frequency of the pumping field is swept/varied and the change in the intensity or polarization of the probe beam is monitored as a function of the modulation frequency).

As indicated above, an additional requirement for obtaining an accurate measurement of the "external" magnetic field B (apart from having a stable/predetermined intensity and polarization, $I_1$ and $P_1$, of the probe light beam LB at the entrance to the vapor cell), is that the instrumental magnetic fields (noise) produced by the magnetometer system 100 itself will vanish in the vicinity of the vapor cell 110, or be at least negligible with intensity below the required sensitivity $\delta B$ sought for the magnetic field B measurement.

To this end, in some embodiments, the optical processor 120 is configured as an all-optical processor, not including any magnetic field generating electrical components (i.e., not generating instrumental magnetic field noise). In this regard, typically, the optical processor 120 may include only passive optical components (i.e., non-electrically controllable), such as liquid crystal elements, polarizers, phase retarders, lens(es) depolarizers, and spectral filters. However, in some embodiments, the optical processor 120 may also include adaptive optical elements, such as adaptive spectral filters, polarizers or lenses, which may be adaptively adjusted to a desired state of operation, while without inducing instrumental magnetic field noise once they are adjusted to a desired state, or inducing only small instrumental magnetic field much below the tolerated sensitivity $\delta B$ in the measurement of the external magnetic field B (such adaptive optical elements may be, for instance, be set to desired state by application of fixed voltages thereto, with no operational electric current therethrough, so that there is no generation of any instrumental magnetic field noise thereby). It is noted that the term sensitivity here designates the noise floor for the measurement (e.g., typically at 1 Hz) or, in other words, the Amplitude magnetic field spectral density at 1 Hz.

A source of prominent instrumental magnetic field noise in the magnetometer system 100, is the light source/pot 150 (e.g., a laser or an output optical port optically coupled thereto) which produces the light beam LB and should therefore be optically coupled to the vapor cell 110.

Therefore, according to some embodiments of the present invention, the light source/port 150 is displaced from the vapor cell 110 by distance d such that it affects only negligible instrumental magnetic field noise which is lower than the required measurement sensitivity δB at the vapor cell 110. In practical implementations of the magnetometer system 100 the displacement distance d between the light source/port 150 and the vapor cell 110 is in the order of one or more meters (typically at least a few meters) in order to obtain accurate magnetic field measurements. This is because with typical laser sources suited for producing the light beam LB, a displacement of about one or more meters would be required in order to obtain a measurement sensitivity δB not exceeding 5 pT/sqrt(Hz) at 1 Hz, and a displacement of one or more would be required. For example, with present lasers, in order to obtain a measurement sensitivity δB of 1 pT/sqrt(Hz) at 1 Hz, an estimated displacement of roughly at least 3 meters is required.

To this end, the optical processor 120 used in the magnetometer system 100 of the present invention facilitates such remote displacement of the light source, while achieving stable/predetermined intensity and polarization, $I_1$ and $P_1$, of the probe light beam LB at the entrance to the vapor cell. This is despite the fact that obtaining suitable light coupling between the light source/port 150 and the vapor cell 110 over such distances (of one or more meters) while preserving both intensity and polarization of the coupled light, is not practical with conventional light couplers, such as waveguides (single mode or PMFs or other waveguides) or free-propagation based coupling. Indeed, as would generally be appreciated by those versed in the art, in non-laboratory conditions, polarization maintaining waveguides and/or free propagation couplers may preserve polarization and/or intensity only at limited distances, typically of less than several meters, and are susceptible to environmental conditions which, in practice, hamper their proper function to maintain intensity and polarization "(e.g. particularly in non-laboratory" conditions such as harsh/"field" conditions where typical magnetic surveys take place).

Thus the optical processor 120, which is used in the magnetometer system 100, is configured and operable to overcome the above obstacles and couple the light beam LB from the light source/port 150 to the vapor-cell 110 over sufficient distance d between them (e.g. one or more meters, to reduce/eliminate the effects of the instrumental noise for the light source/port 150 on the magnetic field measurement) while facilitating robust and accurate predetermined intensity and polarization of the light beam LB that is coupled to enter the vapor cell 110 so as to enable accurate measurement of the magnetic field B.

As shown in FIG. 1, the optical processor 120 is generally located in close vicinity to the vapor cell 110 (whose distance is much smaller than the distance d between it or the vapor-cell and the light source/port 150), and may be optically coupled from its output end/port OOut to the vapor cell 110 via direct optical coupling (e.g. via physical attachment to an optical window/region at the wall of the vapor cell, or via short free propagation path to such optical window/region), or via a short polarization maintaining waveguide (not specifically shown) which is capable of bridging the short distance between the optical processor 120 and the vapor cell 110 while maintaining both polarization $P_1$ and intensity $I_1$ of the light beam $LB(I_1,P_1)$ propagating from optical processor 120 to the vapor cell 110 (as said, the distance from the optical processor 120 to the vapor cell 110 is short enough, typically much less than 1 meter, thus enabling preservation of both intensity and polarization via either direct optical coupling of the optical processor 120 to the vapor cell, or by utilizing short polarization maintaining waveguide/fiber). From its input optical port OIn, the optical processor 120 is coupled to the light source/port 150, which is distanced by the distance d of one or more meters away, typically by optical fiber/waveguide (e.g., preferably a single mode waveguide, although multi-mode waveguide may also be used in certain embodiments), or otherwise via free propagation of the light beam LB from the light source/port 150 to the optical processor 120. It should be noted that although (coupling the light beam from the light source/port 150 to the optical processor 120 by free propagation (e.g., through air) is generally possible over limited distances of up to about 3 to 5 meters. As in some implementations of the system, robust operation is desired with larger distance separating between the light source/port 150 and the optical processor 120, optical coupling via waveguide, preferably SMF, may preferred in such implementations.

In this regard, it should be noted that optical coupling between the light source/port 150 and the input optical port OIn of the optical processor 120 over the distance d need not preserve the polarization P of the light beam LB provided by the light source 150 or affect it in any predetermined manner but may also totally scramble its polarization without substantially impairing the accuracy of the magnetic field measurement by the magnetometer system 100 of the present invention. On the other hand, the intensity $I_0$ of the light beam LB at the input optical port OIn of the optical processor 120 should be predetermined/stable with an accuracy of about +−10%, and thus it may either be measured at the entrance of the optical processor 120, or otherwise typically the intensity I of the light beam LB output/produced by the light source/port 150 is known/predetermined (at least to the required 10% accuracy) and also the attenuation of the light during its propagation from the light source/port 150 to the input optical port OIn of the optical processor 120 is predetermined/stable (e.g. up to about similar accuracy), so that the intensity $I_0$ of the light beam LB at the input optical port OIn is also predetermined/stable.

Thus, according to some embodiments of the present invention, the optical processor 120 is adapted to output the light beam $LB(I_1, P_1)$ with said certain predetermined/stable intensity $I_1=(\alpha \pm \Delta\alpha)I_0$, whereby $\Delta\alpha$ designates an uncertainty of deviation of the predetermined intensity $I_1$ from its nominal value (relative to the initial intensity $I_0$). Preferably the optical coupler 120 is configured and operable such that said uncertainty of deviation does not exceed: $\Delta\alpha$ 1.0%, regardless of the initial polarization state $P_0$ of the light beam LB when entering said optical processor 120 (which is generally unknown). This facilitates accurate determination of said Larmor frequency of precession LF based on the light captured by said detector 130.

Generally, various types of depolarizers may be used as the optical depolarizer 122 of the optical processor 120. For instance, a wedge type depolarizer may be used.

However, in some embodiments, the light beam LB (at least its probe light beam component ProbLB) should be preferably monochromatic with a wavelength suitable for interacting with the precessing Alkali-like atoms AA in order to obtain improved SNR and facilitate accurate measurement. More specifically, for example, in order to achieve sufficiently high SNR and accurate magnetic field measurement with measurement sensitivity $\delta B$ of tens of PicoTesla/sqrt(Hz) at 1 Hz or better, the probe light beam $LB(h, P_1)$, which is directed to interact with the Alkali atoms AA in the vapor cell 110, should be substantially monochromatic with narrow spectral linewidth $\Delta v$ substantially smaller than the shortest separation between adjacent hyperfine structure transitions of the fine-structure absorption lines (D1 or D2) of the Alkali atoms AA (e.g. absorption lines which are due to spin-orbit interaction in the Alkali atoms AA). For example, for Cesium type Alkali atoms the spectral linewidth $\Delta v$ is less than 1 GHz (without any broadening). To this end, in some embodiments, the monochromatic probe light beam LB is typically set to extend over only a narrow spectral linewidth $\Delta v$ that may be for example at least 2-3 times smaller than the shortest separation between two adjacent hyperfine structure transitions of the fine-structure absorption lines (D1 or D2) of the Alkali-like atoms AA (such monochromatic light beam covers a range of wavelengths $[\lambda \pm \Delta\lambda/2]$ whereby $\Delta v = c\Delta\lambda/\lambda^2$ where c is the speed of light.

The optical processor 120 is therefore adapted to direct the probe light beam $LB(I_1, P_1)$ to propagate to the vapor cell 110 as a monochromatic and polarized light beam having narrow spectral linewidth $\Delta v$ as well as predetermined intensity and polarization state, hand $P_1$.

Moreover, in order to achieve the sufficiently high SNR, the light beam LB (at least its probe light beam component ProbLB) should preferably also have substantially narrow width/diameter D, with, for example, a mean cross-section width/diameter of about D<10 millimeters. This is in order for the beam's waist to be narrow enough to be distanced from the vapor cell's walls so as to prevent/reduce the probe light beam ProbLB interaction with decoherent Alkali-like atoms AA near the vapor cell's walls (so that the atomic coherence of the Alkali atoms AA, with which the beam interacts, is maintained). In this regard it is noted that the beam typically enters the vapor cell 110 through an optical window of typically small diameter D, e.g. of less than D≤25 mm, so that a small width D of about W<10 millimeters is required to displace the beam from the walls at which the atomic coherence of the Alkali atoms is reduced/destroyed (e.g. due to interactions with vapor cell's walls—which is the reason for confining them by using buffer gas of high enough pressure). Another reason for the use of a probe light beam $LB(I_1, P_1)$ having a small width, with the same aim to improve the signal to noise ratio (SNR) of the measurement, is that the probe light beam $LB(I_1, P_1)$ should also preferably have sufficiently high flux density F1 to facilitate an efficient interaction of the probe light beam $LB(I_1, P_1)$ with the Alkali-like atoms AA in the vapor cell. Therefore, to achieve that, the optical processor 120 may be configured to output the probe light beam $LB(I_1, P_1)$ with a relatively narrow cross-sectional area A (for example typically the cross section area A does not exceed $A \leq 80\ mm^2$, i.e. cross-sectional width of W<9 mm) thereby yielding the probe light beam $LB(I_1, P_1)$ with sufficiently high flux density $F1 \geq I_1/A \equiv (\alpha \pm \Delta\alpha)I_0/A$ to enable the efficient interaction thereof with the Alkali atoms AA and thereby improve the SNR of the detection.

Thus, for accurate magnetic field measurement, the probe light beam $LB(I_1, P_1)$ should be substantially monochromatic (e.g., with spectral line width $\Delta v \ll 10$ GHz) and narrow (e.g. with cross-sectional area $A \leq 80\ mm^2$ — i.e. beam diameter of about W<9 mm).

To this end, the inventors of the present invention noted that various types or depolarizers may be less suited for use in the optical processor 120 incorporated in the magnetometer system 100, as they might not provide a sufficiently low degree of polarization when operating on monochromatic and/or on narrow beams. For example, utilizing wedge type depolarizers in the optical processor 120 (such as a Cornu depolarizer, quartz-silica or Quartz-quartz wedge depolarizers or any other wedge type depolarizers which are based on the use of wedge/prism of birefringent material) may restrict the accuracy/sensitivity of the measurement of the Larmor precession frequency LF by the magnetometer 100, and thus the accuracy of the measured magnetic field B. This is because wedge type depolarizers operate properly for depolarizing light beam to a small degree of polarization, only when the light beam is broadband (e.g., has a broad spectral linewidth $\Delta v$ in the order of tens of GHz or more), or when the cross-section of the beam spot is significantly wide (e.g., a beam width of at least tens of millimeters). Other types of depolarizers, such as the Cornu depolarizer, are also not suited for depolarizing monochromatic or quasi-monochromatic beams. Time-variable depolarizer types, such as rotating halfwave plate depolarizers, or adaptive depolarizers, may also not be suited for use in the optical processor 120 as they provide unstable depolarization over time, and their operation may be associated with electronics producing instrumental magnetic field noise in the vicinity of the vapor cell.

Graph G2 in FIG. 3 illustrates for example the degree of polarization obtainable by a wedge type depolarizer interacting with such a light beam of monochromatic wavelength $\lambda$ of about $\lambda$=895 nm, as a function of the beam's diameter D. As shown, for any diameter smaller than 10 mm, the degree of polarization, DoP, obtained by such a de-polarizer, is relatively high, above 40% percent. This, in turn, means that utilizing such a depolarizer in the optical processor 120 will yield an unstable/un-predictable intensity of the probe light beam at the output of the optical processor 120. This is because the degree of polarization of the light beam through the polarizer is so high (above 40%), that the intensity filtered by the subsequent polarizer is unknown to about the same factor (40%). Therefore, in this case (where monochromatic and narrow-diameter probe light beam is to be used), utilizing the wedge type depolarizer will not yield an output probe light beam with stable/predetermined intensity $I_1$.

Therefore, in some embodiments of the present invention, the depolarizer 122 includes, or is a constituted by, a pseudo-random or random spatial pattern retarder 122.1 configured and operable for spatially randomizing the polarizations of different cross-sectional regions within a cross-sectional area A of the light beam. Accordingly, a beam of light launched into the spatial pattern retarder 122.1 is substantially depolarized, as different cross-sections thereof undergo different polarization variations.

The spatial pattern retarder 122.1 may include, for example, a patterned wave plate, or an arrangement of a plurality of wave plates of various relative retardation phases $\Gamma$ (e.g., half-wave, quarter-wave, etc.) spatially distributed in a randomized or pseudo-randomized arrangement, such that different cross-sectional regions in the cross-section A of the light beam undergo different polarization variations when passing therethrough. The spatial pattern retarder 122.1 may, for example, include a layer of birefringent material, including a plurality of regions having fast and slow axes with several different orientations (e.g., typically at least four), or a spatial arrangement of birefringent material elements with different orientations of their fast and slow axes. The spatial pattern retarder 122.1 of the optical processor 120 may generally include a passive/static module having a fixed pseudo-random or random spatial pattern of the orientations of its fast and slow axes. Alternatively, or additionally, and although not necessarily needed, the optical processor 120 may optionally also be implemented with an adaptive spatial pattern retarder 122.1 including an arrangement of regions whose retardation relative phases $\Gamma$ can be adaptively controlled (in this case, care should be taken that, when set, the adaptive setting of the randomized or pseudo-randomized arrangement of different retardation phases will not induce any instrumental magnetic field noise).

To this end, FIGS. 2A and 2B schematically respectively illustrate, in a self-explanatory manner, the front and perspective views of a random/pseudo-random spatial pattern retarder 122.1 which may be included in, or may constitute, the depolarizer 122 according to some embodiments of the magnetometer system 100 of the present invention. FIG. 2A shows the front view of the random/pseudo-random spatial pattern retarder 122.1 where the arrangement of regions of different retardation phases $\Gamma$ at those regions are represented by different grayscale shades (as depicted by the legend on the left of the figure). FIG. 2A shows the perspective view of the random/pseudo-random spatial pattern retarder 122.1 where, as shown according to this example, the spatial pattern retarder 122.1 includes a layer of liquid crystal polymer (LCP) with a preset pattern configured to yield the pseudo-random arrangement of regions of the different retardation phases $\Gamma$.

According to some embodiments of the present invention, the spatial pattern retarder 122.1 is configured such that a beam of light, propagating therethrough, undergoes substantial depolarization, e.g. to a degree of polarization less than DoP≤10%, and even substantially monochromatic components of the light beam, e.g. having spectral linewidth $\Delta\nu$ of a few GHz ($\Delta\nu<10$ GHz) and in some embodiments having spectral linewidth $\Delta\nu$ in the order of 1 GHz or below ($\Delta\nu$ 1 GHz), with narrow width D≤10 mm (e.g. cross-section area below A≤80 mm$^2$) become substantially depolarized to the degree below DoP≤10%.

Graph G1 in FIG. 3 illustrates, for example, the degree of polarization obtainable by a spatial pattern retarder 122.1 such as that illustrated in FIG. 2A, for a monochromatic light beam as a function of the beam's diameter D. As illustrated for diameter above about 2 mm, a high degree of depolarization is obtained (with DoP of about 5% or below). Therefore, as shown, in comparison to the wedge type depolarizers whose depolarization functionality is illustrated in graph G2, the random or pseudo-random spatial pattern retarder 122.1 provides an improved degree of polarization for narrow width monochromatic light beams, thus facilitating highly accurate magnetic field measurements when incorporated in the magnetometer system 100 of the present invention.

For example, in some embodiments the spatial pattern retarder 122.1 is configured to provide depolarizing the light beam LB (at least its probe beam component ProbLB) to a degree of polarization (DOP) equal or less than DOP 10% where the light beam or its probe beam component is monochromatic with a wavelength band within the range of [$\lambda\pm\Delta\lambda/2$] where $\Delta\lambda$, which is the full width at half maximum of the wavelength band, does not exceed $\Delta\lambda\leq1.33$ femtometer (equivalent to linewidth of about $\Delta\nu\leq500$ MHz), and its cross-sectional area A or a diameter D of the beam does not exceed A≤19.6 mm$^2$ (e.g. its diameter width D does not exceed D≤5 mm). The wavelength of the light beam LB (or at least its probe beam component ProbLB) is in this example $\lambda=895$ nm which is suitable for probing the Larmor precession frequency LF of the Alkali atoms AA.

It should be noted that once the light beam LB is depolarized by the depolarizer 122, the polarizing effect of the polarizer 126 of the optical processor 120 attenuates the light beam LB passing through the polarizer, by a polarization filtering factor $\alpha_{pol}$ whereby $\alpha_{pol}=0.5^*\pm0.5^*1\alpha_{pol}$ where $\Delta\alpha_{pol}$, being an uncertainty $\Delta\alpha_{pol}$ in the polarization filtering factor, is given by about the degree of polarization in the light beam depolarized by the depolarizer 122: $\Delta\alpha_{pol}=$DoP. This is because half of the intensity of the light that is unpolarized by the depolarizer 122 is filtered by the polarizer 126 while the remaining polarized light that is not depolarized by the depolarizer 122 (i.e., the DoP part), depending on its polarization, may or may not be filtered to a certain degree by the polarizer 126. Thus, the predetermined intensity $I_1$ of the light beam LB output from the optical processor 120 is a predetermined fraction $\alpha$ of the initial intensity $I_0$ of the input light beam with uncertainty $\pm\Delta\alpha$, whereby:

$$I_1=(\alpha\pm\Delta\alpha)I_0\equiv(\alpha_{a/s}\pm\Delta\alpha_{a/s})(\alpha_{pol}\pm\Delta\alpha_{pol})I_0$$

where $\alpha_{a/s}$ is a factor representing the attenuation of the light beam through the optical processor 120 due to absorption/scattering which are not due to the polarization manipulation performed by the combination of the depolarizer 122 and the polarizer 126 (e.g. due to absorption by different effects such as spectral filtration, opacity and/or scattering), and $\Delta\alpha_{a/s}$ is an uncertainty in the absorption/scattering attenuation by optical components other than the depolarizer 122 and polarizer 126 of the optical processor 120. The absorption/scattering attenuation factor by components other than the polarizer $\alpha_{a/s}$ may be a certain predetermined a priori known constant characteristic of the considered of the optical processor 120 (which is typically close to unity $\alpha_{a/s}\approx1$ e.g. unless significantly absorbing optical components such as spectral filters are included in the optical processor 120. The absorption uncertainty $\Delta\alpha_{a/s}$ is not due to the polarization manipulation performed by the combination of the depolarizer 122 and the polarizer 126 is typically negligible $\Delta\alpha_{a/s}/\alpha_{a/s}\sim0$, since, in most implementations, the coefficients of optical absorption/scattering by optical components of the optical processor 120 other than the depolarizer 122 and polarizer 126 are generally a priori known with accuracy. Accordingly, for simplicity, the maximal deviation $\Delta\alpha$ in the certain predetermined intensity $I_1$ of the output light beam LB relative to the initial intensity $I_0$ of the input light beam LB is given by:

$$I_1/I_0=(\alpha\pm\Delta\alpha)\approx\alpha_{a/s}(\alpha_{pol}\pm\Delta\alpha_{pol})$$

where $\alpha_{a/s}$ is typically about 1. Thus, the uncertainty in a maximal deviation of the output intensity $I_1$ of the light beam LB relative to the initial intensity $I_0$ substantially does not exceed the degree of polarization (DoP) of the light beam output from said depolarizer, since $\Delta\alpha_{pol}=$DoP. Accordingly, utilizing incorporation of the spatial pattern retarder 122.1 as/in the depolarizer 122 of the optical processor 120 facilitates highly accurate magnetic field measurements, since its output degree of polarization is very low, even for monochromatic narrow beams, and therefore the intensity $I_0$ of the probe light beam ProbLB output from the optical processor 120 (as well as its polarization) can be determined with accuracy, which enables accurate magnetic field measurement.

As indicated above, since the light source/port 150 may be a source of prominent instrumental magnetic field noise, in some embodiments, particularly in cases where high sensitivity of the magnetic field measurements is sought, the magnetometer system 100 is configured such that the light source/port 150 displaces the light source/port 150 from the vapor cell 110 (to which it is optically coupled via the optical processor 120) by displacement distance d, which is selected such that the instrumental magnetic field noise from the light source/port 150 has negligible effect on the SNR/sensitivity δB of the of the magnetic field measurement at the vapor cell 110 (or, in other words, the magnetic field noise AB at the vapor cell 110 is lower than the required sensitivity δB of the measurement).

To this end, in some embodiments of the present invention, the magnetometer system 100 is configured such that the light source/port 150 (e.g. the laser producing the light beam LB is distanced from the vapor cell 110 by a distance d of at least one or more meters d inn so that its instrumental magnetic field noise does not substantially affect the measurement (i.e. to reduce effects of electromagnetic fields produced by electronics of said light source 150 from affecting measurement of the external magnetic field B by magnetometer 100). Typically, the distance d is greater than one meter, and may be several meters or more. In some embodiments the magnetometer system 100 is associated with, or includes an optical waveguide 140 (e.g., an optical fiber) arranged for propagating the light beam LB from the light source/port 150 to the vapor cell 110. The optical waveguide/fiber 140 may, for example, extend between the light source/port 150 and the optical processor 120 (e.g. its optical input OIn) where the optical output OOut of the optical processor 120, which is adjacent to the vapor cell 110, may be optically coupled to the vapor-cell 110 for example typically optically coupled directly (or, alternatively, it may possibly be optically coupled by another fiber/waveguide not specifically shown in the figure, being a short polarization maintaining fiber having a length substantially shorter than 1 meter, e.g. not more than a few tens of centimeters, such that the short polarization maintaining fiber does not substantially affect the polarization of the light passing therethrough).

It should be noted that the terms: optical fiber, optical waveguide, fiber, and waveguide are used herein interchangeably to designate, in general, any suitable optical structure (rigid or flexible) capable of guiding optical beams/waves along a certain optical path defined by the waveguide, while restricting transmission of optical energy from outside that optical path.

It should be noted that, typically, polarization maintaining fibers (PMFs) do not operate properly when their length is large (e.g., larger than about one or more meters) and their polarization maintaining property is not adequately maintained with such lengths, as it may be susceptible to mechanical deformations and temperature variations of the fiber along its length. However, the optical processor 120 obviates a need for the optical fiber 140 to be configured or to function as a polarization maintaining fiber over its length d (which is typically greater than one meter, in the order of several meters or longer). This is because, as explained above, given a predetermined initial intensity $I_0$ and arbitrary polarization of the light beam LB which exits the fiber 140 and enters the optical processor 120, the optical processor 120 is configured to adjust both the polarization and the intensity of the light beam output therefrom to determined values $I_1$ and $P_1$. Accordingly, the optical processor 120 obviates a need for utilizing a PMF fiber for guiding the beam from the light source 150 to achieve that goal (and, as said above, practically, conventional PMF fibers are not suited for this purpose over lengths of over 1 meter).

In some embodiments, preferably the optical fiber 140 is configured as a single mode fiber/waveguide (SMF). This provides several advantages in the properties of the light beam LB, which exits the fiber 140, and enters the optical processor 120:

d. With single mode fiber/waveguide (SMF) the output light beam LB from the fiber 140 has a relatively uniform direction of propagation (e.g., smaller numerical aperture (N/A)) as compared, for example, to multimode fibers/waveguides (MMFs), e.g., since SMF outputs a single ray, as opposed to several rays output by MMF.

e. With single mode fiber/waveguide (SMF), the output light beam LB from the fiber 140 has typically a Normal (Gaussian) spatial intensity distribution which is more uniform as compared, for example, to multimode fibers/waveguides (MMFs); e.g., since SMF outputs a single central spot/mode, as opposed to several spatially distributed modes/spots output by MMF;

f. With single mode fiber/waveguide (SMF) the output light beam LB from the fiber 140 maintains a narrower chromatic distribution (e.g., is more monochromatic), as lesser dispersion is affected by SMFs as compared to a comparable MMF of similar length;

At least these advantages make the use of SMF as the fiber 140 preferable in some embodiments of the magnetometer system 100 since it allows the probe light beam ProbLB entering the vapor cell to be more monochromatic and have higher flux and more uniform intensity distribution across its cross-section, thereby improving the light-beam's interaction with the Alkali-like atoms AA, which are probed along its path and reducing the noise (e.g. due to non-interacting light) sensed by the detector 130, thus improving a signal to noise ratio (SNR) of detection of light indicative of the Larmor frequency of precession by the detector 130. Moreover, experiments done by the inventors showed that improved performance of the magnetometer system 100 may be obtained when using an SMF as the input fiber/waveguide 140 to the optical processor 120 (since a lower DoP at the output of the spatial pattern retarder 122.1 of the optical processor 120 may be achieved when SMF is the input fiber 140, as compared, for example, to the case of using a comparable MMF fiber). As said above, while the optical fiber 140 may, in some embodiments, be configured as an SMF fiber/waveguide, it does not need to be or function as a polarization maintaining fiber (PMF) over its length d.

It should be noted that the fiber 140 and/or the light source 150 may be a part of the magnetometer system 100 or may be external modules to which the magnetometer system 100 is adapted to be coupled. In the former case, for example, the fiber 140 may be a part of the optical processor 120 such that it is adapted for optically coupling to a remote light source/port 150 (over a distance of at least d) for outputting a light beam, which has both predetermined intensity $I_1$ and predetermined polarization $P_1$ (e.g., suitable for probing a vapor cell 110).

Optionally, in some embodiments, the magnetometer system 100 includes an intensity adjustment module 320 capable of adjusting the intensity $I_1$ of the light beam LB such that at the entrance to the optical processor 120 it has a certain preset initial intensity $I_0$ (or otherwise such that at the entrance to the vapor cell 110 it has the certain predetermined intensity $I_1$). The intensity adjustment module 320 may, for example, include an optical amplifier for adjustably amplifying the intensity of the light beam LB to a desired degree and/or an optical attenuator arranged in the propagation path of the light beam LB for adjustably attenuating it to a desired degree, and/or it may include a light source controller connectable to light source/port 150 for adjusting its output intensity. As the intensity adjustment module 320 typically includes electronic components, it is typically located remotely from the vapor cell 110 (e.g., near or at the light source port 150 at a distance of about d>1 meter or before the optical fiber 140) in order to avoid instrumental noise therefrom from having a substantial effect on the measurement. The system 100 may also include a controller 160 connectable to the intensity adjustment module 320 and configured and operable to operate the intensity adjustment module 320 to attenuate or amplify the light beam LB to a controllable degree to yield certain predetermined intensities $I_1$ of the light beam LB at the entrance to the vapor cells 110. To this end, the controller 160 may, for example, utilize data/signals indicative of the optical attenuation properties of the respective optical processor 120 and or the fiber 140 and/or of any other optical component along the beam's path from the light source/port 150 (as well as possibly data/signals indicative of the intensity output from the light source/port 150) and operate the intensity adjustment module 320 according to these optical attenuation properties to attenuate or amplify the light beams to a designated intensity $I_1$ at the entrance to the respective vapor cell 110.

As indicated above and would be readily appreciated by those versed in the art, in the example of FIG. 1, the Alkali-like atoms AA may be pumped to energy levels, at which they precess with the Larmor frequency LF, by any one of various known in the art techniques, such as by optical pumping or by electronic (e.g., RF) pumping. However, in some embodiments of the present invention, in which particularly sensitive magnetic field measurements are sought, use of optical pumping is preferable over electronic/RF pumping. This is because instrumental magnetic field noise sourced by electronic/RF pumping may deteriorate the allowable measurement sensitivity. Indeed, also with optical pumping, the laser optical-source/port used to source the pumping field may also introduce instrumental magnetic field noise interfering with the measurement sensitivity. To resolve that, and to facilitate high sensitivity magnetic field measurement, the present invention provides a technique for placement of the optical light source/port 150 remote from the vapor cell 110, so as to avoid/reduce its instrumental magnetic field noise from interfering with the measurement, while still enabling determination of the properties (intensity and polarization) of the probe's light ProbLB entering the cell 110 cell to allow the measurement.

Figure 4:
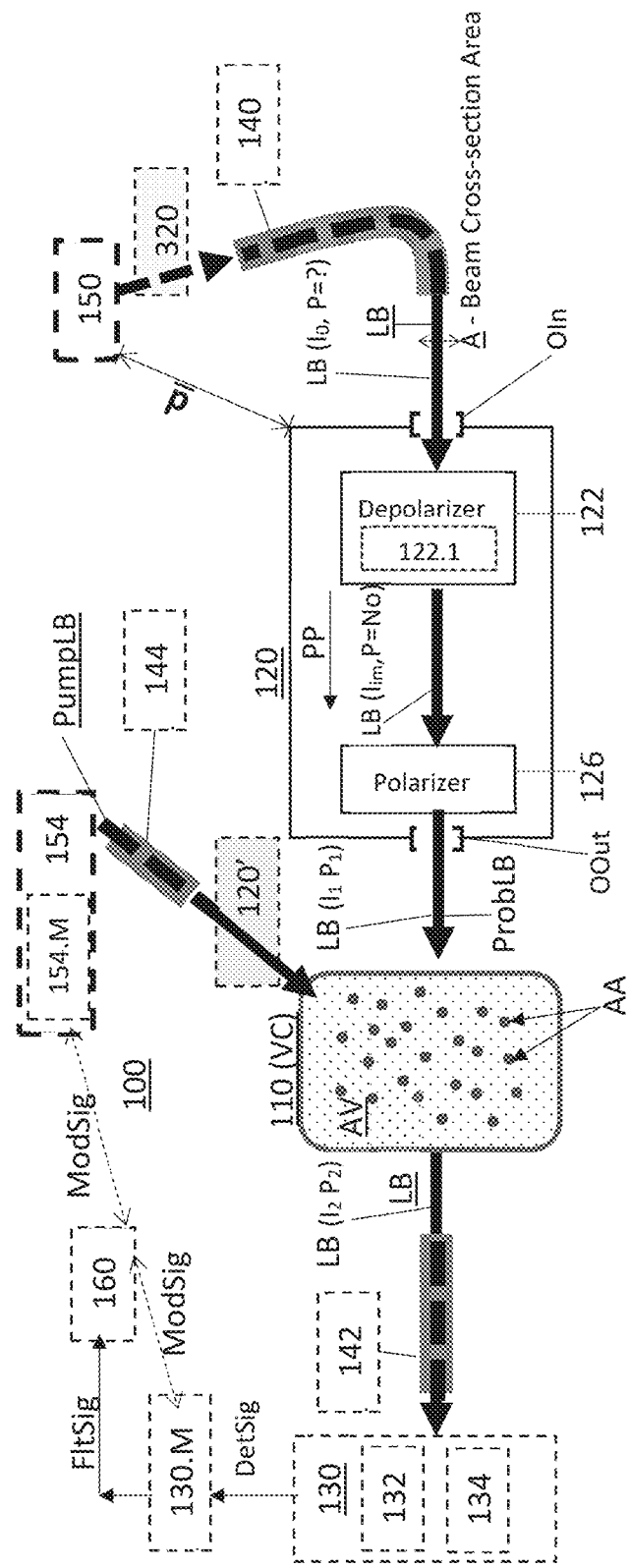
FIG. 4 is a block diagram schematically illustrating an All-Optical magnetometer system configured according to an embodiment of the present invention.
Figure 5:
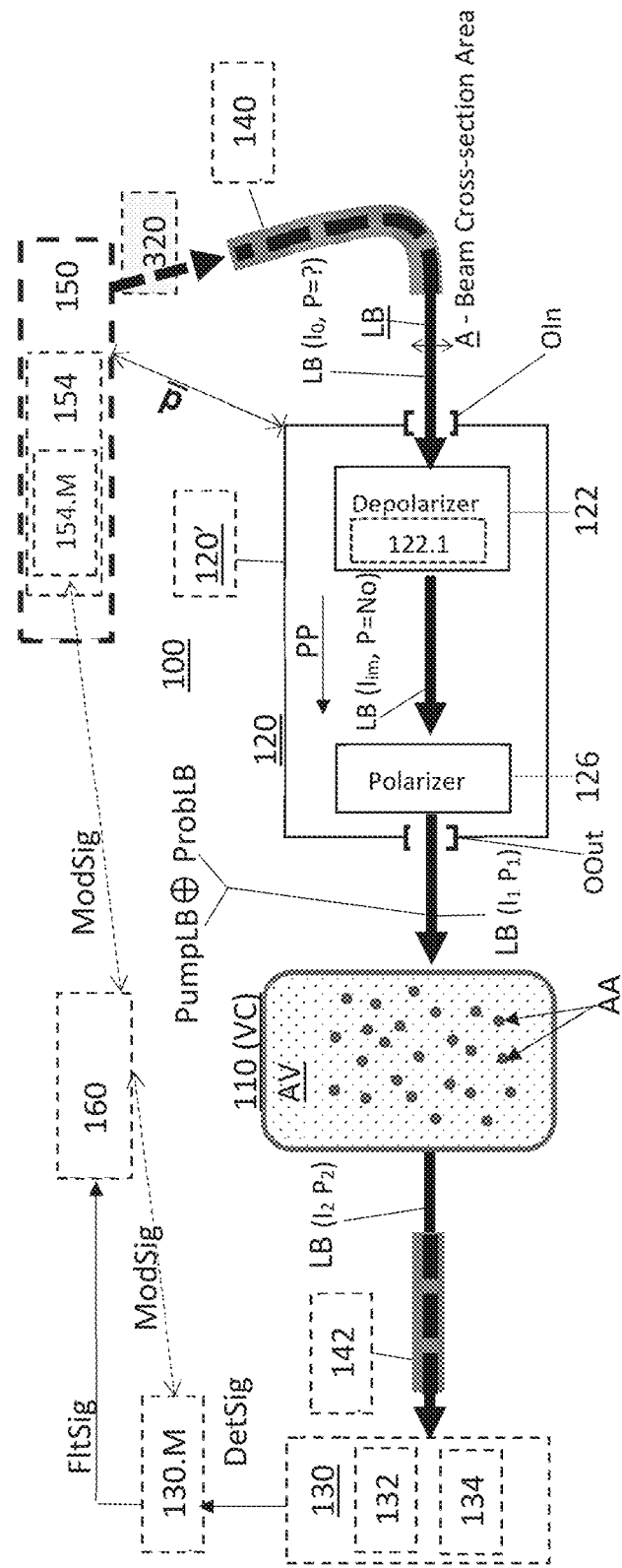
FIG. 5 is a block diagram schematically illustrating an All-Optical magnetometer system configured according to an embodiment of the present invention and having a Bell-Bloom configuration.

FIGS. 4 and 5 exemplify two embodiments of the magnetometer system 100 of present invention configured with an All-Optical setup, in which both the pumping of the Alkali-like atoms AA, as well as the probing of their Larmor frequency of precession LF, are performed optically. This provides for further diminishing of the magnetic field noise in the vicinity of the vapor cell 110, since the Alkali atoms AA are excited/pumped by the pumping light beam PumpLB thereby avoiding adverse effects of electromagnetic fields produced by electronic pumping/excitation of the Alkali atoms (e.g. due to electromagnetic source in the vicinity of the atomic vapor, or any electric wires/coils, laser drivers, photodiodes power supplies, etc.) from affecting measurement of said magnetic field by said magnetometer.

It should be understood that the magnetometer systems 100 in the embodiments of FIGS. 4 and 5 may include/incorporate any, or all, of the essential features, components and functions which are described above in relation to the magnetometer system 100 of FIG. 1, as well as the optional features, components and/or functions described in relation to the magnetometer system of FIG. 1. Accordingly, for clarity, similar/like reference numerals, as in FIG. 1, are maintained also in FIGS. 4 and 5, and are used to designate similar components, features and/or functions. It should be understood that the above descriptions of these components, features and/or functions, as presented in relation to the magnetometer system of FIG. 1, also apply to the embodiments of FIGS. 4 and 5 (possibly with proper adaptations to the embodiments in those figures, as would readily be appreciated by those versed in the art) and, for clarity and conciseness, and are not repeated in relation to FIGS. 4 and 5.

FIG. 4 is a block diagram illustrating the magnetometer system 100 of the present invention according to an All-Optical embodiment thereof, in which the pumping light beam PumpLB and the probe light beam ProbLB, are configured as separate light beams (e.g., propagating to the vapor cell along to distinct optical paths). As shown, since the polarization and intensity of the pumping light beam PumpLB need not be specifically known/maintained for carrying out the measurement, it does not need to necessarily pass-though, or be processed-by, an optical processor, such as the optical processor 120 by which the probe light beam ProbLB is processed before entering the vapor cell 110 (accordingly, a relatively more energy efficient optical pumping is achieved, as compared to the embodiment of FIG. 5, since, as said above, the processor 120 attenuates to about half the intensity of light beam processed thereby).

FIG. 5 is a block diagram illustrating the magnetometer system 100 of the present invention according to an All-Optical embodiment thereof configured and a so-called Bell-Bloom optical setup, in which a single light beam LB is configured for, and functions, for both the pumping/excitation of the Alkali-like atoms AA as well as for the probing/detection of their Larmor frequency. Thus, the probe and the pump light beam components ProbLB+PumpLB of the single light beam LB, are processed together by the optical processor 120, as shown in the figure.

Referring together to the embodiments shown in both FIGS. 4 and 5, it should be noted that the source/port 154 of the pumping light beam PumpLB is preferably separated from the vapor cell 110 by a distance d of one or more meters, to prevent/reduce instrumental magnetic field noise from interfering with the measurement of the external magnetic field B at the vapor cell 110. Similarly, as described above with respect to the probe light beam ProbLB, the pumping light beam may generally be arranged to propagate from its source/port 154 towards the location of the vapor cell along a free propagation path. However, in some embodiments, in which a more robust setup is required, the magnetometer system may include a waveguide/fiber 144 for guiding the pumping light beam PumpLB towards the region of the vapor cell 110 (in the Bell-Blum configuration of FIG. 5, the source/port 154 of the pumping light beam PumpLB may be the same as the source/port 150 of the probe light beam ProbLB, and both the pumping light beam PumpLB and the probe light beam ProbLB may typically be directed to propagate via the same waveguide 140 towards the optical processor 120).

It should be noted that in some implementations the magnetometer system may be configured and operable for probing precession of said Alkali-like atoms utilizing a free induction decay (FID). In such embodiments the pumping light beam PumpLB need not be necessarily modulated.

In some embodiments, at least one of a frequency, amplitude, or polarization of said pumping light beam PumpLB is modulated at a modulation frequency.

In some implementations, the properties of pumping light beam PumpLB are somewhat different from those of probe light beam ProbLB. Alternatively, in some implementations pumping light beam component PumpLB and the probe light beam component ProbLB are actually implemented by a single laser source and implemented by a single beam, thereby having similar properties.

To this end, in some embodiments of the magnetometer system 100, the pumping light beam PumpLB is modulated. The modulation may, for example, be a frequency modulation (FM) and/or an amplitude modulation (AM) and/or polarization/helicity modulation (PM) and/or any other suitable modulation which a person of ordinary skill in the art would consider suitable. It is understood that in embodiments, e.g., in a Bell-Bloom setup where the pump beam functional component and the probe functional component are implemented via a single light beam, both components are similarly modulated. The magnetometer system 100 may, for example, include a modulator 154.M configured for applying the modulation to the pumping light beam PumpLB (and possibly also the probe light beam/component ProbeLB).

To this end, in some implementations the magnetometer 100 may be adapted to measure the magnetic field B by carrying out the following:
  (i) Applying a modulation to the pumping light beam PumpLB (e.g., by utilizing the modulator 154.M). The pump beam may be, for example, modulated in amplitude (AM), frequency (FM) and/or polarization (PM) at a certain modulation frequency, which, when it becomes similar to the Larmor frequency, excites the states of the Alkali atoms;
  (ii) Sweeping/Varying the frequency of the modulation through a plurality of modulation frequencies over a range of frequencies (e.g., by controlling/adjusting the modulator's 154.M operation);
  (iii) Measuring the final intensities $I_2$ and/or the final polarization states $P_2$ of the probe light beam ProbLB, as obtained when the pumping light beam PumpLB is modulated by different modulation frequencies of the plurality of modulation frequencies, across which the modulation is swept/verified. The final intensities $I_2$ and/or the final polarization states $P_2$ are measured on the probe light beam ProbLB after it had interacted with the Alkali atoms AA, e.g., after it had excited the vapor cell 110. The measurement may be carried out by utilizing the detector 130, for example by a photodetector 132 capable of measuring light intensity or by a polarimeter capable of measuring polarization state;
  (iv) Determining the difference $\Delta I$ between the predetermined intensity $I_1$ and the final intensity $I_2$ or determining the difference $\Delta P$ between predetermined polarization state $P_1$ and the output polarization state $P_2$ as a function of the plurality of modulation frequencies, across which the modulation is swept/verified. For example, per each modulation frequency of said plurality of modulation frequencies, a controller/computer 160 determines/computes the change $\Delta I$ or $\Delta P$;
  (v) Then, identifying the Larmor frequency LF, which is indicative of the measured magnetic field B according to the modulation frequency, bringing the difference $\Delta I$ or $\Delta P$ to an extremum point. For example, according to the modulation frequency in which the difference/change in the intensity $\Delta I$ or polarization $\Delta P$ of the probe beam ProbLB is maximal or minimal (e.g., depending on the configuration of the magnetometer system 100).

Thus, according to some embodiments of the present invention, the magnetometer system 100 may include a controller 160 that is configured and operable for operating the system 100 to carry out the above operations (i) to (v) for measuring the magnetic field B.

It should be understood that the terms controller or control system, as used herein interchangeably, may refer to an analog and/or digital circuit, and/or to a computer exactable code implementable on a digital processor, or a combination thereof, which is configured and operable for carrying out the controlling functions for which it is designed. The controller may include or be associated with an input for receiving input data/signals pertaining to its operation, and a driver or an output for outputting data or signals, which result from the controller's operation, and are provided to the system/module controlled by the controller for controlling their operation accordingly. A person of ordinary skill in the art will readily appreciate how to implement the controllers with the configuration described in the present application using any one of various known technologies.

The magnetometer system 100 may optionally include a modulator 154.M capable of modulating the pumping light beam PumpLB with modulation frequencies within a certain modulation frequency range appropriate for determining the Larmor frequency LF. The suitable modulation frequency range for detecting magnetic fields of certain magnitudes, will be generally known to those versed in the art. For example: for measurement of magnetic fields B of magnitudes in the order of 15 µT-100 µT and the modulation frequency range may be 52.5 kHz-350 kHz when using for Cesium atoms, or, in another example, when using Rubidium, it may be in the range of 105 kHz-700 kHz. For example, the controller 160 may provide the modulator 154.M with signal/data ModSig indicative of the modulation frequency by which it is to modulate the beam at each time. In this example, the magnetometer system 100 may also include a lock-in module 130.M adapted connectable to receive the detection signal/data DetSig from the detector 130 and configured and operable to filter the detection signal/data DetSig according to the modulation frequency indicated by the modulation signal/data ModSig, and thereby determine obtain filtered signal/data FltSig indicative of at least one of the final intensity $I_2$ or the output polarization state $P_2$ of the probe light beam ProbLB detected by the detector 130 at the respective modulation frequency.

As indicated above, in some embodiments the controller 160 is adapted for sweeping/varying the frequency of the modulation over the range of frequencies and carrying out the following at each modulation frequency of one or more modulation frequencies within said range:
  a. operate the modulator 154.M to modulate the pumping light beam PumpLB with the modulation frequency;
  b. obtain the final intensity $I_2$ or the output polarization state $P_2$ of the probe light beam ProbLB as obtained corresponding to the respective modulation frequency of the pumping light beam PumpLB;

c. determine a difference ΔI or ΔP, between the final intensity $I_2$ predetermined initial intensity $I_1$ or between the final polarization state $P_2$ and the predetermined initial polarization state $P_1$, of the probe light beam ProbLB per each of the plurality of modulation frequencies;

d. determine/compute the Larmor frequency LF based on this difference, ΔI or ΔP, as determined for said one or more modulation frequencies.

It should be noted that, typically, in implementations such as illustrated in FIG. 5, where a single beam LB is used for both the pump-beam PumpLB and the probe-beam ProbLB, typically both the pump-beam PumpLB and the probe-beam ProbLB components of the single beam LB (e.g., from a single source) are modulated. Then, at the detection path, the modulation of the probe beam components is filtered for example by a locking amplifier, in order to obtain a detection signal indicative of the measured Larmor frequency.

In implementations such as illustrated in FIG. 4 where there are separate beams, pump-beam ProbLB and the probe-beam ProbLB, the pump beam PumpLB is typically modulated (its amplitude, frequency and/or polarization), while the probe beam ProbLB need not necessarily be modulated.

It some embodiments where such configuration is possible, the pumping light beam PumpLB is preferably circularly polarized to improve the efficiency of excitation of the Alkali atoms by the pumping light beam PumpLB.

Optionally, in some embodiments, before entering the vapor cell 110, the pumping light beam PumpLB is directed to pass through a certain optical processor 120' configured and operable for outputting the pumping light beam PumpLB with or determined/stable intensity and polarization towards the vapor cell 100. The configuration of the certain optical processor 120' may be similar to that of the optical processor 120 and it may include an optical depolarizer and a polarizer (not specifically shown in the figure) arranged respectively successively with respect to a propagation direction of said pumping light beam PumpLB (it is noted that the types of the depolarizer and the polarizer of the optical processor 120' may optionally be different than those of the optical processor 120. The certain optical processor 120' which may be used pumping light beam PumpLB may be the same as the optical processor 120 used for the probe light beam ProbLB, as shown in FIG. 5 in which the pumping light beam PumpLB and the probe light beam ProbLB are directed along a common optical path and may be considered components of the same beam. Alternatively, the certain optical processor 120' operating on the pumping light beam PumpLB may be separate/different to as the optical processor 120 operating on the probe light beam ProbLB, as optionally shown in FIG. 4.

The above method for measurement of the magnetic field B is exemplified with reference to the All-Optical embodiments of the magnetometer system 100 of the present invention in which optical pumping is used, as illustrated in FIGS. 4 and 5. In this regard it should be understood that the present invention is not limited by this specific measurement method, and a person of ordinary skill in the art will readily appreciate other measurement methods which can be implemented to measure magnetic fields utilizing various embodiments, All-Optical or electronically/RF-pumped, of the magnetometer 100 of the present invention.

Referring now together to FIGS. 1, 4 and 5, as indicated above, the measurement of the magnetic field may be based on measurement of either the final intensity $I_2$ or final polarization state $P_2$ of the probe light beam after its interaction with the Alkali-like atoms AA in the vapor cell 110.

In embodiments where intensity measurement is used, the detector 130 typically includes a photodetector 132 capable of detecting a final intensity I2 of the probe light beam ProbLB after passage through the vapor cell 110. The Larmor precession frequency LF of the Alkali atoms AA, and thus the magnetic field B, is thereby determined based on the measured difference between the predetermined intensity I1 and the final intensity I2 of the probe light beam ProbLB. It should be noted that in such embodiments, where intensity-based measurement is used, the polarization state $P_1$ of the probe beam ProbLB may be linear, circular, or elliptical. Preferably the polarization state $P_1$ of the probe beam ProbLB is circular polarization to thereby improve the rate of interaction of said probe light beam ProbLB with precessing Alkali atoms.

In embodiments where polarization measurement is used, the detector 130 typically includes a polarimeter 134 capable detecting/obtaining data/signals indicative of the final state of polarization P2 of the probe light beam ProbLB after its interaction with the Alkali atoms AA in the vapor cell 110 (or the difference ΔP between the final and initial polarization states, P2 and P1). It is noted that the term polarimeter is used herein to designate generally any suitable type of polarization detector, for example a regular-polarimeter, or a differential-polarimeter.

To this end, in some embodiments the polarizer 126 of the optical processor 120 is a linear polarizer, providing that the predetermined polarization state $P_1$ is linear and includes both left and right circularly polarized beam components of the probe light beam ProbLB. Accordingly, the polarimeter 134 is capable of detecting a difference between the interaction of the left and right circularly polarized beam components of the probe light beam with the Alkali atoms AA in the vapor cell 110, and said difference is indicative of the population of Alkali atoms AA precessing with the Larmor frequency.

As indicated above, the detector 130, which should also be optically coupled to the vapor cell 110, may present another source of instrumental magnetic field noise (which may be of lesser magnitude than the noise produced by the light source/port(s) e.g. 150, 154). However, introducing a displacement between the detector 130 and the vapor cell 110 that is sufficient to yield its instrumental magnetic field noise of the detector 130 negligible at the vapor cell 110, is less problematic (as compared to displacement of the light source 150) because various measurement schemes may require only the information of one of the intensity $I_2$ and polarization $P_2$ of the light beam after its propagation through the vapor cell 110 to be preserved and detected by the detector 130. This facilitates optical coupling between the vapor cell 110 and the detector 130 from a distance.

Indeed, in some embodiments where the detector 130 includes a photodetector 132 and the magnetic field is measured by measuring the intensity $I_2$ of the probe light beam ProbLB after its passage through the vapor cell 110, one or more optical fibers (e.g. a single fiber) may be used for coupling the vapor cell 110 to the photodetector 132 over a distance of 1 meter or more, or even a few meters or more, while robustly preserving the information of the intensity $I_2$ of the probe light beam ProbLB after its output from the vapor cell 110.

Alternatively or additionally, in embodiments where the detector 130 includes a polarimeter 134 and the magnetic field is measured by measuring the polarization state $P_2$ of the probe light beam ProbLB after its passage through the vapor cell 110, at least one polarization maintaining fiber may be used for coupling the vapor cell 110 to the photodetector 132 over distance in the order of 1 meter (while independently carrying at least two polarization components of the light beam), or at least two optical fibers, which need not be necessarily PMFs, and may be arranged for separately carrying the two polarization components of the probe light beam ProbLB to the polarimeter 134 over even larger distances than one meter. In the latter case for example, a polarization beam splitter (e.g., a Wollaston prism) may be arranged between the vapor cell and two optical fibers for splitting the two polarization components of the probe light beam ProbLB to propagate separately through the two fibers to the detector or different balanced photodetectors 130. Accordingly, utilizing one of the above configurations, probe light beam ProbLB may be coupled to the detector 130 over a distance of one meter or more, while robustly preserving the information of the polarization $P_2$ of the probe light beam ProbLB after its output from the vapor cell 110.

Thus, according to some embodiments of the present invention the magnetometer is configured as an all-optic magnetometer, and the detector is displaced from the vapor cell with a distance configured such that, at said vapor cell, the instrumental magnetic field noise from the detector 130 is below a designated magnetic field measurement accuracy/sensitivity to be obtained by the magnetometer system 100. For example, the detector 130 may be displaced from the vapor cell 110 by a displacement distance (not specifically shown in the figures) of at least one or more decimeters or even higher, i.e., at a distance of one or more meters.

The magnetometer system 100 may include an optical collection assembly 142, including for example one or more optical fibers/guides that are adapted for receiving the light beam LB after its passage through the vapor cell 110 and optically coupling it with the detector 130. The optical collection assembly 142 includes, for example, one or more optical fibers/guides. The optical collection assembly 142 may include for example:
   a. one (or more) optical fibers (not necessarily PMFs) when intensity measurement is used;
   b. one (or more) PMF optical fibers or two or more not necessarily PMFs fibers, when polarization measurement is used.

This facilitates the magnetometer's configuration as a fully all-optic magnetometer with no electrical component in the vicinity of the vapor cell 110 (at least none which generate an instrumental magnetic field noise).

This may be particularly practical in embodiments where the magnetic field B is measured based on the intensity $I_2$ of the light beam LB (i.e., the detector 130 is a photodetector) and there may be no need to preserve the final polarization $P_2$ of the probe beam LB after its interaction with the vapor cell 110. In this respect, the intensity-based measurements (i.e., the detector 130 is a photodetector 132) may be advantageous over polarization based measurements in terms of their ability to measure small magnetic fields B, since it allows the detector to be distanced to relatively large distances from the vapor cell, thus practically avoiding instrumental magnetic field noise from the detector 132.

Reference is now made to FIGS. 6A and 6B schematically illustrating, in a block diagram and a flow chart respectively, an optical processor 120 and a method 200 for optical processing of a light beam LB according to an embodiment of the present invention.

The optical processor 120 is configured for receiving a light beam LB of a certain initial intensity $I_0$ and undetermined polarization $P_0$ as an input, and processing said light beam LB to output the light beam LB with a certain output intensity $I_1$ relative to said initial intensity $I_0$ and certain predetermined polarization state $P_1$. The optical processor 120 includes an optical depolarizer 122 and a polarizer 126 arranged respectively successively (e.g., not necessarily consecutively) with respect to a propagation direction of the light beam LB, along a propagation path PP thereof through the optical processor 120. The depolarizer 122 is adapted to depolarize the light beam LB to yield a depolarized light beam. The polarizer 126 is arranged to subsequently polarize the depolarized light beam, to produce the predetermined polarization state $P_1$ and the relative intensity $I_1$ of the light beam LB output from the optical processor 120.

Typically, the certain relative output intensity $I_1$ is a predetermined fraction $\alpha$ of the initial intensity $I_0$, $I_1 = (\alpha \pm \Delta\alpha) I_0$, whereby $\Delta\alpha$ designates an uncertainty of deviation of the output intensity $I_1$ from a nominal value thereof relative to the initial intensity $I_0$. In some implementations the optical processor 120 is configured and operable such that the uncertainty of deviation does not exceed $\Delta\alpha \leq 10\%$, regardless of the initial polarization state $P_0$ of the light beam LB when entering the optical processor 120.

In some embodiments the depolarizer 122 includes a pseudo-random, or random, spatial pattern retarder 122.1 that is configured and operable for spatially randomizing the polarizations of different cross-sectional regions within a cross-sectional area A of the light beam. This for example facilitates that the processed light beam LB be a substantially monochromatic light beam, for instance the light beam may have a wavelength band $\Delta\lambda$ with full width at half maximum in the order of several hundreds of femto-meters or even less i.e., and in some cases wavelength band $\Delta\lambda$ not exceeding a few Femto-meters (e.g. $\Delta\lambda \leq 1.33$ Femto-meter).

The pseudo-random, or random, spatial pattern retarder 122.1 may include a spatial distribution of tens or more regions of various retardation properties (preferably hundreds or thousands of regions), randomly or pseudo randomly arranged across the cross-sectional area of the depolarizer 122, through which the light beam LB is designated to pass. In some embodiments the light beam LB is designated to pass through a narrow cross-sectional area $A \leq 80$ mm$^2$ of the depolarizer 122 or smaller, for example in the order of several mm$^2$ or even less than 1 mm$^2$ (e.g. use of a light beam LB of narrow cross-sectional area A of 3 mm$^2$ was experimented successfully by the inventors, and the result of said experiment provided indication that the technique of the present invention may be operated with beams of even narrower cross-sectional area A for example of 0.3 mm$^2$).

To this end, in some embodiments, the spatial pattern retarder 122.1 provides for depolarizing of the light beam to a degree of polarization (DoP) equal or lesser than DoP$\leq 10\%$ when depolarizing a narrow monochromatic light beam having wavelength band within the range of $[\lambda \pm \Delta\lambda/2]$ where $\Delta\lambda$ is a full width at half maximum of the wavelength band, in the order of one or more Femto-meters, and diameter D of the beam in the order of a few millimeters.

The spatial pattern retarder 122.1 may for instance include a layer of liquid crystal polymer (LCP) with a spatial distribution of tens or more regions of various retardation properties (preferably hundreds or thousands of regions), randomly or pseudo randomly arranged across the cross-sectional area of the depolarizer 122.

As indicated above in the discussion with reference to FIG. 1, the polarizing effect of said polarizer causes attenuation of the light beam passing through the polarizer, by a polarization filtering factor $\alpha_{pol}=0.5*\pm 0.5*1\alpha_{pol}$ whereby the uncertainty $\Delta\alpha_{pol}$ in the polarization filtering factor $\Delta\alpha_{pol}$ is given by a degree of polarization (DOP) of the light beam output from said depolarizer. The output intensity $I_1$ is therefore a predetermined fraction $\alpha$ of the initial intensity $I_0$, such that $I_1=(\alpha\pm\Delta\alpha)I_0\equiv(\alpha_{a/s}\pm\Delta\alpha_{a/s})$ $(\alpha_{pol}\pm\Delta\alpha_{pol})I_0$ whereby $\alpha_{a/s}$ and $\Delta\alpha_{a/s}$ are respectively an absorption/scattering attenuation factor of the light beam absorption and/or scattering through the optical processor 120 ($\Delta\alpha_{a/s}$ is typically negligible, so the maximal deviation $\Delta\alpha$ in the output intensity $I_1$ of the light beam relative to the initial intensity $I_0$ of the light beam through the optical processor, is given by $I_1/I_0=\alpha_{a/s}(\alpha_{pol}\pm\Delta\alpha_{pol})$.

Optionally, in some embodiments the optical processor 120 includes an intensity adjustment module 320 capable of adjusting the intensity of the light beam LB such that the output intensity $I_1$ is set to a designated value. The intensity adjustment module 320 may, for example, include an optical amplifier for adjustably amplifying the intensity of the light beam LB to a desired degree, and/or an optical attenuator arranged in the propagation path of the light beam LB for adjustably attenuating it to a desired degree, and/or it may include a light source controller adapted to adjust the intensity of the source. To this end, the optical processor 120 may include a controller (not specifically shown in the figure) that is configured and operable to operate the intensity adjustment module 320 to attenuate or amplify the light beam LB by a controllable degree to yield the designated output intensity $I_1$ thereof.

Optionally the optical processor 120 may include additional optical components along the optical path of the beam LB, such as lenses, filters diffractive elements, or other optical components as may be required for the optical processing purpose for which the optical processor 120 may be used. In some implementations one or more of such additional optical components may also be adapted optical components, whose optical effect on the beam is controllable/adjustable. For example, one such adaptive optical component may be the optional intensity adjustment module/utility 320 described above.

In some embodiments the optical processor 120 may be configured as an All-Optical processor having no electric components. Alternatively, or additionally, in some embodiments the optical processor 120 may be configured as a pseudo-All-Optical processor in the sense that it does not include electrically controlled components near the output port OOut at which the beam exits the optical processor 120. In the latter case, electronically controlled adaptive optical components (such as the optional intensity adjustment module 320), if such, are included in the optical processor 120, and are preferably located remotely from the output port OOut, e.g., by a distance of one or more meters.

Referring to FIG. 6B a method 200 for optical processing of the light beam LB which may be implemented by the optical processor 120 is diagrammatically illustrated in a self-explanatory manner. The method includes the following operations:

210: providing a light beam LB having a certain initial intensity $I_0$ and undetermined polarization $P_0$. Optionally, 212—the light beam LB may be substantially monochromatic as indicated above. Optionally, as also indicated above, 214—the light beam LB may have a narrow characteristic cross-sectional area A (narrow diameter characteristic diameter D).

230: depolarizing the light beam LB to yield the light beam LB with certain intermediate intensity relative to the initial intensity $I_0$ and un-polarized polarization state. Optionally, as indicated above, 232—the depolarizing may be carried out by utilizing a random spatial pattern retarder 122.1 for spatially randomizing the polarizations of a plurality of different cross-sectional regions within a cross-sectional area A of the light beam. This facilitates the depolarization of a light beam which is either monochromatic, has narrow width, or both, to a high degree of depolarization (e.g., DOP below 10% or even below 5%).

250: subsequent to the depolarizing 230, polarizing the light beam LB to the designated predetermined polarization state $P_1$ as required at the output. Accordingly, in 270: yielding the light beam LB with a certain predetermined intensity $I_1$ relative to said initial intensity $I_0$ and the required predetermined polarization state $P_1$.

290 (optional): The method may optionally include adjustment to the initial intensity $I_0$ of the light beam LB in accordance with a designated intensity $I_1$ required at the output and in accordance with the intensity attenuation, which is affected on the light beam LB during the processing (for example by operations 230 and 250). This will yield the light beam LB at the output having a designated intensity $I_1$ and the designated predetermined polarization state $P_1$.

Other variations of the method 200, or additional optional operations which may be incorporated in the method 200, will be readily appreciated by those versed in the art, and/or may be readily understood in light of the detailed description above regarding the optical processor 120.

In some cases, particularly in cases where there is a need to spatially map a magnetic field B over a certain region/axis x, B(x), or to determine the gradient $\partial_x B$ or gradient mapping $\partial_x B(x)$ of the magnetic field B, a plurality of magnetic field measurements of the field B are needed at a number of points/locations at that region/axis x. Particularly in cases where the spatial map of the magnetic field B is required with high accuracy/sensitivity (e.g., sensitivity $\delta B$ in the order of several Pico-Tesla at 1 Hz or better), vapor cell based magnetometers, such as those discussed above with reference to FIGS. 1, 4 and 5, may be used at the different locations in the region x. The plurality of measurements at the different locations are required to be relatively accurate and sensitive (i.e., accurate relative to one another) to provide such mapping accurately. In some embodiments this may be achieved by utilizing sensitive vapor cell magnetometers configured according to the present invention, as illustrated for instance in FIG. 1, and preferably by utilizing All-Optical magnetometers, such as those shown in FIGS. 4 and 5, as they provide higher signal to noise ratio (SNR). Indeed, slight variations in the intensity $I_1$ of the probe light beam ProbLB at the input into the vapor cell 110 has no significant effect on the accuracy/sensitivity of the measurement when a single measurement (e.g., at a single location) is concerned. However, when considering a plurality of measurements over the region x for mapping the magnetic field B in that region x, carried out by a plurality of the magnetometers 100, slight variations in the intensities $I_1$ of the probe light beams ProbLB input into the vapor cells 110 and the magnetometers 100 at the different locations may result in poor relative accuracies of the measurements by the different magnetometers 100 thus impairing the collective sensitivity of the mapping the magnetic field B in that region x.

Figure 7:
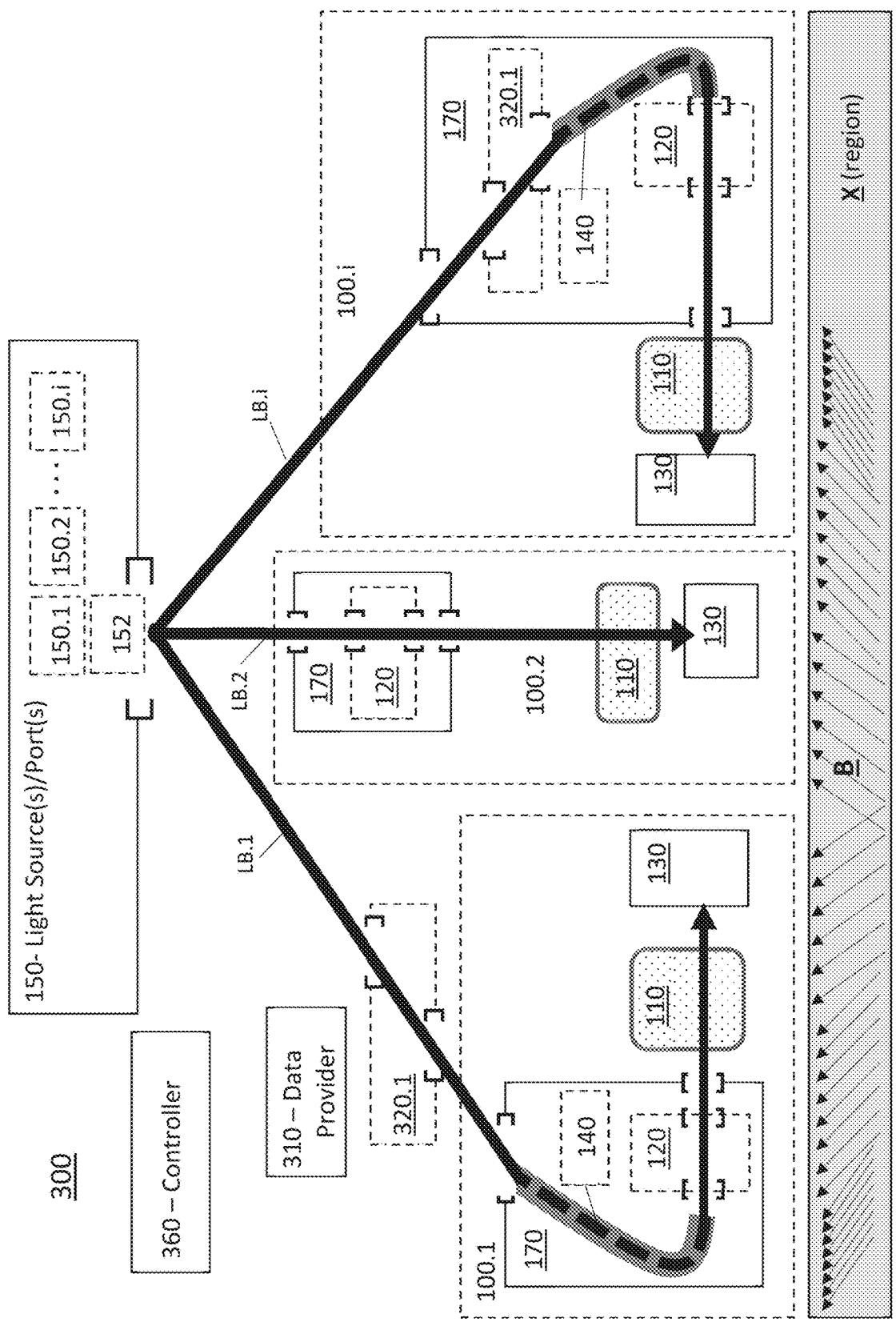
FIG. 7 is a block diagram schematically illustrating a spatially distributed magnetometer array/network according to an embodiment of the present invention.

To this end, reference is now made to FIG. 7 in which a spatially distributed magnetometer array/network 300, according to an embodiment of the present invention, is schematically illustrated. The spatially distributed magnetometer array/network 300 includes a plurality of magnetometers {100.*i*} for measuring a magnetic field B in a region x (in respective vicinities of the magnetometers). In this non-limiting example, three magnetometers {100.1, 100.2 and 100.*i*} are illustrated as an example. However, it should be clear that any number of magnetometers may be included in the network/array 300. The region x over which said mapping is to be performed may be one, two, or three dimensional, and the magnetometers {100.*i*} of the network may be arranged accordingly.

As shown, each magnetometer 100.*i* of the one or more magnetometers {100.*i*} of said plurality includes at least the following components:
- a. a respective vapor cell 110 of the magnetometer 100.*i* which contains atomic vapor AV;
- b. a respective optical coupler 170 of the magnetometer 100.*i* for optically coupling between a light source 150 providing a respective light beam LB.i (e.g., a probe-beam or probe+pump beam) for the magnetometer 100.*i*, and the vapor cell 110 of said magnetometer 100.*i*;

The spatially distributed network/array 300 includes:
- c. a reference data provider 310 (e.g., data storage or a network communication module or one or more sensors) which are capable of providing data indicative of the optical attenuation properties of the respective optical couplers 170 of the one or more magnetometers {100.*i*}. For instance, predetermined data indicative of the respective optical coupler's 170 attenuation properties may be stored and a data storage (remote or local), or any suitable sensors/or sensory channels, may be used to determine said attenuation properties.
- d. one or more intensity adjustment modules {320.*i*} capable of adjusting the intensities $I_1$ of the respective light beams LB.i of the magnetometers {100.*i*} such that at the entrance to the corresponding vapor cells 110 of the magnetometers (e.g., at the outputs from the corresponding optical couplers 170) the light beams LB.i have certain predetermined intensities $I_1$. For instance, the intensity adjustment modules {320.*i*} may include optical amplifier(s) and/or optical attenuator(s) arranged in the propagation paths of the respective light beam {LB.i} of the different magnetometers which are capable of amplifying or attenuating the intensity of the light beam by an adjustable degree of amplification/attenuation LB. Alternatively or additionally, the intensity adjustment modules {320.*i*} may include light source controller(s) connectable to light source(s)/port(s), e.g. 150.1 to 150.*i* of the light source module/system 150 and adapted for adjusting the output intensity of the respective light sources/ports; and
- e. at least one controller 360 connectable to the one or more intensity adjustment modules {320.*i*} and to the reference data provider 310 and configured and operable to carry out the following:
  - (i) obtain the optical attenuation properties of the respective optical couplers 170 from the reference data provider 310;
  - (ii) operate the one or more intensity adjustment modules {320.*i*} according to the optical attenuation properties of the respective optical couplers 170 of the magnetometers {100.*i*} to attenuate or amplify the respective light beams (LB.i) by controllable degrees to yield certain predetermined intensities $I_1$ of the light beams (LB.i) at the entrance to respective the vapor cells 110 of their associated magnetometers, and thereby facilitate an accurate and sensitive magnetic field mapping at the region x. It is noted that the controllable degrees of attenuation/amplification may be determined by the controller based on the optical attenuation properties of the respective optical couplers 170 and based on data indicative of the intensities of the light beams (LB.i) at the output from the light source system/module 150—where the latter may be predetermined and/or may be measured/calculated (for example using the power consumption of the light sources {150.*i*}) and/or it may be indicated by data (e.g. which may be provided or stored by reference data provider 310).

It should be clarified that in various implementations the light source system/module 150, may or may not be a part of the spatially distributed magnetometer network/array 300 of the present invention, or may be external thereto. The light source system/module 150 may include one light source/port (e.g., 150.1; e.g., a laser) or several light sources/ports (e.g., 150.1, 150.2, 150.*i*; e.g., several lasers) and may be a single or distributed system. In embodiments where a common light source/laser 150.1 is used for several magnetometers, a beam splitter module 152 may be included to split the beam from the light source to the several magnetometers.

It should be noted that in some embodiments, high relative accuracy between the magnetic field B measurements by the different magnetometers {100.*i*} is obtained when their respective light beams LB.i have similar predetermined intensities at the entrance to their respective vapor cells. Accordingly, in such embodiments, the controller 360 may be configured and/or operable for operating the intensity adjustment modules {320.*i*} such that the certain predetermined intensities $I_1$ of the light beams LB.i are adjusted to such certain similar predetermined intensity $I_1$ for a plurality of said magnetometers {100.*i*}, to thereby obtain accurate and comparable values of the magnetic field B measurements by the plurality of magnetometers {100.*i*}.

It is noted that the light couplers 170 typically include respective optical assemblies, each including one or more optical components along the respective light propagation path of its respective light beam from the light source module 150 to its respective vapor cell 110. Accordingly, the respective optical attenuation properties of the light couplers 170 are associated with (i.e., are a function of) the optical attenuation of their respective optical components, particularly of those having a relatively substantial attenuation e.g., in the order of one or more percent, or even less.

To this end, as illustrated in FIG. 7, the optical assemblies of one or more of the light couplers 170 may include respective optical fibers 140 for propagating the respective light beam along at least a part of the light propagation path from the light source module/system 150 to the respective vapor cell 110. As the optical fibers 140 may be relatively long in order to displace the electronics from the vapor cell (e.g., to avoid instrumental noise, as discussed above), the respective optical attenuation properties of the light couplers 170 may be primarily determined/representative of the attenuation properties of their respective fibers respectively (unless additional components of relatively high attenuation are included in the optical assemblies, in which case the attenuation of such components may also need to be taken into account in the respective optical attenuation properties of the light couplers). Thus, in some embodiments, the optical attenuation properties of the light couplers 170 as provided/stored by the data provider 310 may be indicative of, or represented by, the lengths of the optical fibers 140 of the respective optical couplers 170 (e.g., the respective optical attenuation properties of at least some of the light couplers 170 may be indicative of respective lengths of their fibers 140). It should be noted that in some embodiments the light couplers 170 of all of the magnetometers {100.i} of the network/array 300 may include respective optical fibers 140.

It should be noted that in some implementations the optical assemblies of one or more of the light couplers 170 may include adaptive optical components, whose light attenuation factors/properties may vary depending on their adaptive state. In such cases the data provider 310 may be configured and operable to provide data indicative of the attenuation factors/properties of the optical couplers corresponding to the adaptive state(s) of such components.

As indicated above, in some implementations accurate/sensitive magnetic field measurement by a magnetometer 100.i is obtained when both the polarization state $P_1$ and the intensity $I_1$ of the respective light beam LB.i of the magnetometer 100.i are known at the entrance to its vapor cell 110. For the reasons explained in detail above, particularly due to the need to displace the vapor cell 110 from the light source system 150 by a significant distance d and the lack of polarization maintaining fibers over such distance, the light beam LB.i may arrive at the vicinity of the vapor cell with undefined polarization. Accordingly, in some embodiments of the invention, the light couplers 170 of one or more of the magnetometers {100.i} (particularly those whose vapor cells are displaced in relatively large distance from the light source system/module 150, and who are equipped with fiber to carry the light beam from the light source module 150 to the vapor cell 110; typically all) include respective optical processor 120 located adjacent to the vapor cell (e.g. by a small distance, preferably not exceeding a few tens of centimeters, or more preferably not exceeding 10 centimeters). The optical processor 120 is configured and operable for receiving the respective light beam LB.i of the respective magnetometer 100.i, whereby the light beam has a certain initial intensity $I_0$ and undetermined polarization $P_0$ and processes the light beam LB.i to yield the light beam LB.i with a certain predetermined polarization state $P_1$ and a certain intensity $I_1$ at the entrance to the vapor cell 110.

The optical processor 120 may generally be configured and operable according to an embodiment of the optical processor 120 and the optical processing method 200 as described in detail in the present application, for example with reference to FIGS. 1 to 6B above.

As indicated above, the light attenuation properties of such an optical processor 120 may be significant (e.g., tens of percent). Accordingly, the respective optical attenuation properties of the light couplers 170, as provided by the data provider 320 may be representative/inclusive of the attenuation properties of their respective optical processor 120 part of the optical couplers 170 (as well as possibly other components of the optical couplers, such as the fibers 140). In other words, the respective optical attenuation properties of the at least some of the light couplers 170 include compensation for the attenuation factor $\alpha$ of their respective optical processor 120.

As exemplified in the non-limiting example of FIG. 7, the intensity adjustment modules {320.i} may be configured and operable for adjusting the initial intensity $I_0$ of the light beam at the entrance to the optical processor 120, at the entrance to the vapor cell 120 (or at the output of the optical processor 120) or the intensity of the light output from the light source system 150, or during its propagation from the light source to the optical coupler 170 or optical processor 120 (see for example the different locations of the adjustment modules {320.i} in the figure).

It should be noted that the spatially distributed magnetometer network/array 300 of the present invention may be configured with one or more of said magnetometers {100.i} as All-Optical magnetometers. Specifically, the All-Optical magnetometers {100.i} may be configured with Bell-Bloom configuration. In some embodiments, the spatially distributed magnetometer network/array 300 of the present invention may be configured and operable as an accurate and sensitive All-Optical magnetometer network/array in which all the magnetometers {100.i} are at least one of:
 a. all optical magnetometers.
 b. Bell-Bloom magnetometers.
 c. magnetometers configured and operable according to any one of the embodiments of FIGS. 4 and 5 above, or according to any other suitable All-Optical, vapor cell based, magnetometer system, as known or will be known in the art.

The invention claimed is:

1. A magnetometer for measuring a magnetic field B in the vicinity thereof, the magnetometer comprising:
 a vapor cell comprising atomic vapor;
 a optical processor for receiving a light beam and directing said light beam, as a probe light beam, to enter the vapor cell with a certain predetermined intensity $I_1$ and certain predetermined polarization state $P_1$ to serve for interacting with at least one type of Alkali-like atom in the atomic vapor of the vapor cell, for probing a Larmor frequency of precession thereof; and
 a detector for detecting the light beam after interaction with the atomic vapor to generate signals/data indicative of said Larmor frequency;
 wherein the optical processor comprises an optical depolarizer and a polarizer arranged respectively successively (e.g. not necessarily consecutively) with respect to a propagation direction of said light beam, along a propagation path of the light beam through the optical processor; wherein the optical depolarizer is adapted to depolarize the light beam to yield a depolarized light beam LB($I_{im}$, P=No); and the polarizer is arranged to polarize the depolarized light beam, to produce said predetermined polarization state $P_1$ of the light beam, thereby forming said probe light beam LB($I_1$, $P_1$) with said predetermined intensity $I_1$ being a predetermined fraction $\alpha$ of an initial intensity $I_0$ of the light beam LB($I_0$, $P_0$=?) and with said predetermined polarization state $P_1$.

2. The magnetometer of claim 1 wherein said optical processor is a adapted to output said light beam LB($I_1$, $P_1$) with said certain predetermined intensity $I_1$ being the predetermined fraction $\alpha$ of said initial intensity $I_0$, $I_1$=($\alpha\pm\Delta\alpha$)$I_0$, whereby $\Delta\alpha$ designates an uncertainty of deviation of said predetermined intensity $I_1$ from a nominal value thereof relative to said initial intensity $I_0$, and wherein said optical coupler is configured and operable such that said uncertainty of deviation does not exceed $\Delta\alpha \leq 10\%$ regardless of an initial polarization state $P_0$ of said light beam when entering said optical processor, to thereby facilitate accurate determination of said Larmor frequency of precession based on the light captured by said detector.

3. The magnetometer of claim 1 wherein said probe light beam is a monochromatic light beam with wavelength $\lambda$ matching one or more fine-structure absorption lines of the Alkali-like atoms.

4. The magnetometer of claim 3 wherein the monochromatic light beam extends over a narrow spectral linewidth $\Delta\nu$ smaller than a shortest separation between two adjacent hyperfine structure transitions of said fine-structure absorption lines of the Alkali-like atoms, to thereby improve a signal to noise ratio (SNR) of light indicative of said Larmor precession captured by said detector.

5. The magnetometer of claim 1 wherein said optical processor is adapted to direct said probe light beam $LB(I_1, P_1)$ to propagate to said vapor cell as a monochromatic polarized light beam having a narrow cross-sectional area preferably not exceeding $A \leq 80$ mm$^2$, thereby efficiently producing said probe light beam with a high flux density $F_1 \geq I_1/A \equiv (\alpha \pm \Delta\alpha)I_0/A$; said high flux density $F_1$ thereby facilitates an efficient interaction of the probe light beam $LB(I_1, P_1)$ with the Alkali-like atoms and thereby improves a signal to noise ratio (SNR) of detection of light indicative of said Larmor frequency of precession by said detector.

6. The magnetometer of claim 1 wherein said depolarizer comprises a pseudo-random, or random, spatial pattern retarder configured and operable for spatially randomizing the polarizations of different cross-sectional regions within a cross-sectional area A of the light beam.

7. The magnetometer of claim 6 wherein said spatial pattern retarder provides for depolarizing said light beam to a degree of polarization (DoP) equal or lesser than DoP$\leq$10% when polarizing a narrow monochromatic light beam having wavelength band within the range of $[\lambda \pm \Delta\lambda/2]$ where $\Delta\lambda$ being a full width at half maximum of the wavelength band, does not exceed $\Delta\lambda \leq 1.33$ femto-meter, and at least one of a cross-sectional area A or a diameter D of the beam does not exceed $A \leq 19.6$ mm$^2$ or $D \leq 5$ mm respectively.

8. The magnetometer of claim 6 wherein said spatial pattern retarder comprises a layer of liquid crystal polymer (LCP).

9. The magnetometer of claim 1 wherein a polarizing effect of said polarizer causes attenuation of the light beam passing through the polarizer, by a polarization filtering factor $\alpha_{pol} = 0.5* \pm 0.5*1\Delta\alpha_{pol}$ whereby an uncertainty $\Delta\alpha_{pol}$ in the polarization filtering factor $\Delta\alpha_{pol}$ is given by a degree of polarization (DOP) of the light beam output from said depolarizer, $\Delta\sigma_{pol} = $ DoP.

10. The magnetometer of claim 9 wherein the predetermined intensity $I_1$ is a predetermined fraction $\alpha$ of the initial intensity $I_0$, such that $I_1 = (\alpha \pm \Delta\alpha)I_0 \equiv (\alpha_{a/s} \pm \Delta\alpha_{a/s})(\alpha_{pol} \pm \Delta\alpha_{pol}) I_0$ whereby $\alpha_{a/s}$ and $\Delta\alpha_{a/s}$ are respectively an absorption/scattering attenuation factor of the light beam absorption and/or scattering through the optical processor, and $\Delta\alpha_{a/s}$ is a negligible uncertainty in said absorption/scattering attenuation factor $\alpha_{a/s}$, $\Delta\alpha_{a/s}/\alpha_{a/s} \sim 0$, so that a maximal deviation $\Delta\alpha$ in the certain predetermined intensity $I_1$ of the light beam relative to the initial intensity $I_0$ of the light beam through the optical processor, is given by $I_1/I_0 = (\alpha \pm \Delta\alpha) \alpha_{a/s}(\alpha_{pol} \pm \Delta\alpha_{pol})$ whereby an uncertainty in a maximal deviation of the output intensity $I_1$ relative to the initial intensity $I_0$ substantially does not exceed the degree of polarization (DOP) of the light beam output from said depolarizer.

11. The magnetometer of claim 1 configured as an all-optical magnetometer, whereby said at least one type of Alkali-like atoms are excited by a pumping light beam, thereby avoiding adverse effects of electromagnetic fields produced by electronic pumping/excitation of the Alkali-like atoms from affecting measurement of said magnetic field by said magnetometer.

12. The magnetometer of claim 1 wherein said detector comprises a photodetector capable of detecting a final intensity $I_2$ of said probe light beam after passage through the vapor cell; said predetermined polarization state $P_1$ of the probe light beam is any one of a linear polarization, a circular polarization, or an elliptical polarization; and wherein a difference between said predetermined intensity $I_1$ and said final intensity $I_2$ is indicative of a Larmor precession frequency of said type of Alkali atoms.

13. The magnetometer of claim 1 wherein said detector comprises a polarimeter capable of detecting data indicative of a change in a state of polarization of probe light beam between its predetermined initial polarization state $P_1$ and the output/final polarization state $P_2$ after interaction of the probe light beam with the atomic vapor in said vapor cell; whereby said change of state of polarization of probe light beam is indicative of a Larmor precession frequency of said type of Alkali-like atoms.

14. The magnetometer of claim 1, wherein the detector is associated with an optical collection assembly including one or more optical fibers adapted for receiving the light beam after passage through the vapor cell and coupling said light beam to the detector, whereby the detector is displaced from the vapor cell.

15. The magnetometer of claim 14 wherein said magnetometer is an all-optic magnetometer and the detector is displaced from the vapor cell such that instrumental magnetic field noise from said detector at said vapor cell is below a designated magnetic field measurement sensitivity to be obtained by said magnetometer system.

* * * * *